(12) United States Patent
Kumauchi et al.

(10) Patent No.: US 6,852,579 B2
(45) Date of Patent: Feb. 8, 2005

(54) METHOD OF MANUFACTURING A SEMICONDUCTOR INTEGRATED CIRCUIT DEVICE

(75) Inventors: Takahiro Kumauchi, Hamura (JP); Makoto Yoshida, Ome (JP); Kazuhiko Kajigaya, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/365,423

(22) Filed: Feb. 13, 2003

(65) Prior Publication Data

US 2003/0157757 A1 Aug. 21, 2003

Related U.S. Application Data

(63) Continuation of application No. 09/741,810, filed on Dec. 22, 2000, now abandoned, which is a continuation of application No. 08/865,706, filed on May 30, 1997, now abandoned.

(30) Foreign Application Priority Data

May 30, 1996 (JP) .............................................. 8-136044

(51) Int. Cl.$^7$ ........................................... H01L 21/338
(52) U.S. Cl. ...................... 438/167; 438/169; 438/197; 438/573; 438/582; 438/685
(58) Field of Search .............................. 438/167, 169, 438/197, 570, 573, 582, 584, 685

(56) References Cited

U.S. PATENT DOCUMENTS

| | | | | |
|---|---|---|---|---|
| 3,914,127 A | * | 10/1975 | Buss et al. | 438/593 |
| 5,188,975 A | * | 2/1993 | Kojima et al. | 438/396 |
| 5,319,231 A | * | 6/1994 | Yamazaki et al. | 257/344 |
| 5,506,166 A | * | 4/1996 | Sandhu et al. | 438/396 |
| 5,693,553 A | | 12/1997 | Kashihara et al. | |
| 5,733,812 A | * | 3/1998 | Ueda et al. | 438/289 |
| 5,736,416 A | * | 4/1998 | Johansson | 438/302 |
| 5,753,530 A | * | 5/1998 | Akamine et al. | 438/560 |
| 5,760,442 A | * | 6/1998 | Shigyo et al. | 257/347 |
| 5,780,345 A | * | 7/1998 | Yamazaki et al. | 438/282 |
| 5,904,556 A | * | 5/1999 | Suzuki et al. | 438/623 |

* cited by examiner

Primary Examiner—W. David Coleman
Assistant Examiner—Khiem Nguyen
(74) Attorney, Agent, or Firm—Antonelli, Terry, Stout & Kraus, LLP

(57) ABSTRACT

Oxidation on the surface of a film of refractory metal constituting a gate electrode (word line WL) is suppressed by forming an insulation film constituting a cap insulation film of the gate electrode (word line WL) at a temperature of 500° C. or lower. Further, oxidation on the surface of the refractory metal film exposed to the side wall of the gate electrode (word line WL) is suppressed by forming an insulation film constituting the side wall spacer of the gate electrode (word line WL) at a temperature of 500° C. or lower.

34 Claims, 18 Drawing Sheets

OXIDATION OF W
(TIME DEPENDENCE)

RELATION BETWEEN FORMING TEMPERATURE AND P-SiN PROPERTIES

METHOD OF MANUFACTURING A SEMICONDUCTOR INTEGRATED CIRCUIT DEVICE

CROSS-REFERENCE TO RELATED APPLICATION

This application is a continuation of application Ser. No. 09/741,810, filed Dec. 22, 2000, now abandoned, which is a continuation of application Ser. No. 08/865,706, filed May 30, 1997, now abandoned.

BACKGROUND OF THE INVENTION

The present invention concerns a technique for manufacturing a semiconductor integrated circuit device having a MISFET (Metal Insulator Semiconductor Field Effect Transistor) and, more in particular, it relates to a technique which may be effectively applied to the manufacture of a DRAM (Dynamic Random Access Memory).

In recent years, in manufacturing steps of LSIs based on the deep submicron design rule, since the accuracy of alignment of a stopper has approached its utmost limit, it has become difficult to ensure a mask alignment margin between a contact hole and a gate electrode upon forming a contact hole for the contact of wirings in a source region and a drain region of a MISFET.

As a countermeasure, a SAC (Self Align Contact) technique of forming a contact hole by self alignment using a silicon nitride film having a fine selectivity ratio of about 10 to 20 relative to a silicon oxide film as an etching stopper has attracted some attention. This is a technique of forming a contact hole by forming an insulation film over a gate electrode (cap insulation film) and a side wall insulation film (side wall spacer) with a silicon nitride film and etching a silicon oxide film deposited over the gate electrode, in which scraping of a gate electrode is prevented by using the cap insulation film and the side wall spacer made of silicon nitride as the etching stopper, thereby making it unnecessary for an alignment margin to be provided between the gate electrode and the contact hole.

The SAC technique using the silicon nitride film has been described, for example, in U.S. Pat. No. 5,188,975 (Japanese Patent Laid-Open Hei 4(1992)-342164).

SUMMARY OF THE INVENTION

In the SAC technique described above, a CVD (Chemical Vapor Deposition) method of reacting monosilane ($SiR_4$) and an ammonia ($NH_3$) gas at a temperature of about 700 to 800° C. is adopted for the formation of a silicon nitride film that constitutes a cap insulation film and a side wall spacer. Alternatively, a CVD method of reacting dichlorosilane ($SiCl_2H_2$) and ammonia (N $H_3$) in a reduced pressure atmosphere at 700 to 800° C. also has been adopted. The possibility of forming a gate electrode or a word line with a refractory metal such as W (tungsten) or Ti(titanium) for improving wiring delay of a gate electrode, or for reducing the resistivity of the word line in DRAM has been considered. However, when the gate electrode or the word line is formed with a refractory metal and a silicon nitride film is further formed thereon for the SAC technique, it has been found by the present inventor that the resistivity of the gate electrode or the word line does not meet a designed value. It has been found in the study by the present inventor that oxygen remains in a furnace when forming the silicon nitride film, which causes oxidation on the surface of the metal material resulting in an increase in the resistivity of the gate electrode, or the relatively high temperature of 700 to 800° C. for forming the silicon nitride film tends to cause easy oxidation.

It is therefore an object of the present invention to provide a technique in a method of manufacturing a semiconductor integrated circuit device for forming a contact hole for the connection of wirings in a source region and a drain region of a MISFET by utilizing the SAC technique, which method is capable of preventing disadvantages that the surface of a metal film is oxidized when an insulation film used as an etching stopper is deposited on a gate electrode containing the refractory metal film.

The foregoing and other objects, as well as novel features of the present invention will become apparent from the descriptions of various embodiments with reference to the appended drawings.

Among the features disclosed in the present application, the following features will be explained briefly below.

(1) The present invention provides a method of manufacturing a semiconductor integrated circuit device having a MISFET, which comprises:

(a) a step of depositing a gate electrode material containing a metal film comprised of a refractory metal over a semiconductor substrate and then depositing a first insulation film over the gate electrode material at a temperature of 500° C. or lower, (b) a step of forming a gate electrode by etching the first insulation film and the gate electrode material using a photoresist as a mask, (c) a step of introducing impurities into the semiconductor substrate, to form a source region and a drain region, (d) a step of depositing a second insulation film having an etching rate approximately identical with that of the first insulation film over the gate electrode at a temperature of 500° C. or lower and then etching the second insulation film, to thereby form a side wall spacer to the side wall of the gate electrode and the first insulation film, and (e) a step of depositing a third insulation film having an etching rate different from that of the first and the second insulation films over the gate electrode and then etching the third insulation film using a photoresist as a mask, to form a contact hole for the connection of wiring to one of the source region and the drain region.

(2) The present invention provides a method of manufacturing a semiconductor integrated circuit device having a MISFET, which comprises:

(a) a step of depositing a gate electrode material containing a metal film comprised of refractory metal over a semiconductor substrate and then depositing a first insulation film over the gate electrode material at a temperature of 500° C. or lower, (b) a step of depositing a second insulation film having an etching rate approximately identical with that of the first insulation film over the first insulation film at a temperature of 500° C. or higher and then etching the second insulation film, the first insulation film and the gate electrode material using a photoresist as a mask, to form a gate electrode, (c) a step of introducing impurities into the semiconductor substrate, to form a source region and a drain region, (d) a step of depositing a third insulation film having an etching rate approximately identical with that of the first and the second insulation films over the gate electrode at a temperature of 500° C. or lower, depositing a fourth insulation film having an etching rate approximately identical with that of the third insulation film at a temperature of 500° C. or higher over the third insulation film and then etching the fourth and the third insulation films, to form a side wall spacer on the side wall of the gate electrode and the first and the second insulation films, and (e) a step of depositing a fifth insulation film having an etching rate different from that of the first to fourth insulation films over the gate electrode and then etching the fifth insulation film by using a photoresist as a mask, to form a contact hole for connection of wiring to one of the source region and the drain region.

(3) The present invention provides a method of manufacturing a semiconductor integrate circuit device having a DRAM provided with a memory cell of a stacked capacitor structure in which bit lines are disposed over a memory selection MISFET and information storage capacitors are disposed over the bit lines, comprising:

(a) a step of depositing a gate electrode material containing a metal film comprised of a refractory metal over a semiconductor substrate and then depositing a first insulation film over the gate electrode material at a temperature of 500° C. or lower, (b) a step of etching the first insulation film and the gate electrode material using a photoresist as a mask, to form a gate electrode for a memory cell selection MISFET, (c) a step of introducing impurities into the semiconductor substrate, to form a source region and a drain region of a memory cell selection MISFET, (d) a step of depositing a second insulation film having an etching rate approximately identical with that of the first insulation film over the gate electrode at a temperature of 500° C. or lower and then etching the second insulation film, to form a side wall spacer to the side wall of the gate electrode and the first insulation film, (e) a step of depositing a third insulation film having an etching rate different from that of the first and the second insulation films over the gate electrode and then etching the third insulation film by using a photoresist as a mask, to form a first contact hole for the connection of a bit line to one of the source region and the drain region, and a second contact hole for connection of a lower electrode of the information storage capacitor to the other of the source region and the drain region, (f) a step of burying plugs to the inside of the first and the second contact holes, depositing a bit line material containing at least one layer of a metal film over the third insulation film and then depositing a fourth insulation film over the bit line material at a temperature of 500° C. or lower, (g) a step of etching the fourth insulation film and the bit line material by using a photoresist as a mask to form a bit line, (h) a step of depositing a fifth insulation film having an etching rate approximately identical with that of the fourth insulation film over the bit line at a temperature of 500° C. or lower and then etching the fifth insulation film, to form a side wall spacer to the side wall of the bit line and the fourth insulation film, and (i) a step of depositing a sixth insulation film having an etching rate different from those of the fourth and fifth insulation films over the bit line and then etching the sixth insulation film by using a photoresist as a mask, to form a third contact hole over the second contact hole for connecting the lower electrode of the information storage capacitor and the other of the source region and the drain region.

(4) The present invention provides a method of manufacturing a semiconductor integrated circuit device having a MISFET with source, drain and gate, comprising:

(a) a step of depositing a first conductive film of a refractory metal over a main surface of a semiconductor substrate and a first silicon nitride film by a plasma CVD method on the first conduction film, (b) a step of fabricating the first conductive film and the silicon nitride film into a predetermined pattern, to form a gate electrode of the MISFET, (c) a step of introducing impurities into the semiconductor substrate in an self alignment manner to the gate electrode for forming semiconductor regions that function as the source and the drain, (d) a step of depositing a second silicon nitride film over the gate electrode by a plasma CVD method, (e) a step of applying anisotropic etching to the second silicon nitride film, to form a side wall spacer on the side of the gate electrode, (f) a step of depositing an oxide film over the gate electrode and the side wall spacer, and (g) a step of applying etching to the oxide film for forming an opening to expose a portion of the semiconductor region to the oxide film.

(5) The present invention provides a method of manufacturing a semiconductor integrated circuit device having a MISFET with source, drain and gate, comprising:

(a) a step of depositing a first conductive film of a refractory metal over a main surface of a semiconductor substrate and a first insulation film on the first conduction film by a plasma CVD method, (b) a step of fabricating the first conduction film and the first insulation film into a predetermined pattern, to form a gate electrode of the MISFET, (c) a step of introducing impurities into the semiconductor substrate in a self-alignment manner to the gate electrode for forming semiconductor regions that function as the source and the drain, (d) a step of depositing a second insulation film over the gate electrode by a plasma CVD method, (e) a step of applying anisotropic etching to the second insulation film, to form a side wall spacer on the side wall of the gate electrode, (f) a step of depositing a third insulation film on the gate electrode and the side wall spacer, and (g) a step of applying etching to the third insulation film for forming an opening to the third insulation film for exposing a portion of the semiconductor region, wherein the etching rate of the first and the second insulation films is lower than the etching rate of the third insulation film in the etching step for forming the opening.

(6) The present invention provides a method of manufacturing a semiconductor integrated circuit device having a MISFET with source, drain and gate, comprising:

(a) a step of depositing a first conductive film of a refractory metal over a main surface of a semiconductor substrate, a first silicon nitride film on the first conductive film and a second silicon nitride film on the first silicon nitride film, (b) a step of fabricating the first conductive film and the first and the second silicon nitride films into a predetermined pattern, to form a gate electrode of the MISFET, (c) a step of introducing impurities into the semiconductor substrate in an self-alignment manner to the gate electrode for forming semiconductor regions that function as the source and the drain, (d) a step of depositing a third silicon nitride film on the gate electrode and a fourth silicon nitride film on the third silicon nitride film, (e) a step of applying anisotropic etching to the third and the fourth silicon nitride films, to form a side wall spacer on the side wall of the gate electrode, (f) a step of depositing an oxide film on the gate electrode and the side wall space, and (g) a step of applying etching to the oxide film for forming an opening to the oxide film for exposing a portion of the semiconductor region wherein the first silicon nitride film is formed at a temperature lower than that for the second silicon nitride film, and the third silicon nitride film is formed at a temperature lower than that for the fourth silicon nitride film.

DESCRIPTION OF THE PREFERRED EMBODIMENTS

Figure 1:
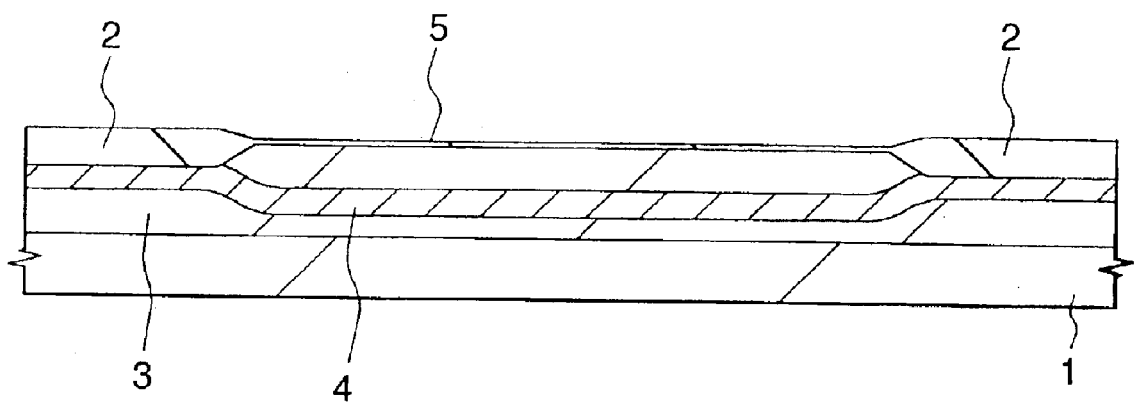
FIG. 1 to FIG. 14 are cross sectional views of a main portion of the semiconductor substrate illustrating sequential steps of a method of manufacturing a DRAM representing an Embodiment I according to the present invention.

The present invention will be described specifically by way of preferred embodiments with reference to the drawings. Throughout the drawings for explaining the preferred embodiments, those components having identical functions carry the same reference numerals for which duplicate explanations will be omitted.

Embodiment 1

This embodiment is applied to a method of manufacturing a DRAM having a memory cell of a stacked capacitor structure in which information storage capacitor is disposed over a memory cell selection MISFET.

For forming the DRAM memory cell, as shown in FIG. 1, a semiconductor substrate I made of ptype single crystal silicon is at first prepared, a field oxide film 2 is formed on the surface thereof by a selective oxidation (LOCOS) method and then p type impurities (B) are ion implanted into the semiconductor substrate I to form a p type well 3. Successively, after ion implanting p type impurities (B) to the p type well 3 to form a p type channel stopper layer 4, a gate oxide film 5 is formed on the surface of an active region of the p type well 3 surrounded by the field oxide film 2.

Figure 2:
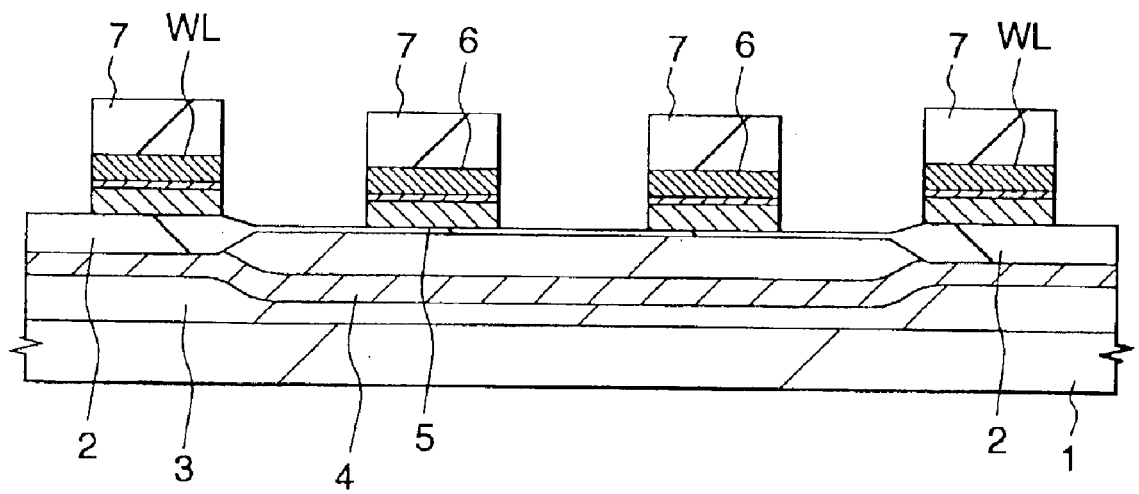

Then, as shown in FIG. 2, a gate electrode 6 (word line WL) of the memory cell selection MISFET is formed. The gate electrode 6 (word line WL) is formed by depositing a polycrystal silicon film on the semiconductor substrate I by a CVD method, then depositing a titanium nitride (TiN) film and a tungsten (W) film, further depositing a silicon nitride film 7 as a cap insulation film by a plasma CVD method and then patterning the silicon nitride film 7, the tungsten film, the titanium nitride film and the polycrystal silicon film by using a photoresist as a mask. In the polycrystal silicon film constituting a portion of the gate electrode 6 (word line WL), phosphorus (P) as an type impurity is doped for reducing the resistance value thereof. The silicon nitride film 7 is formed by a plasma CVD method of reacting monosilane ($SiR_4$) and ammonia ($NH_3$) as reaction gases in a plasma atmosphere. The temperature for the wafer during film formation is 500° C. or lower, that is, from 250 to 350° C.

The gate electrode 6 (word line) is constituted by a metal film comprised of a polycrystal silicon film and a refractory metal, and a reaction preventive film of a polycrystal silicon film and a refractory metal. The metal film means herein, for example, tungsten (W), titanium (Ti), tantalum (Ta) and molybdenum (Mo) as the refractory metal and does not include a silicide film of the refractory metal. This is because the silicide film of the refractory metal is scarcely oxidized at a temperature from 700 to 800° C. thus resulting in no problem of reducing the resistance of the gate electrode 6 (word line).

The reaction preventive film is used for preventing siliciding reaction between the polycrystal silicon film and the refractory metal, which may be made of a material such as tungsten nitride (WN) and aluminum oxide in addition to titanium nitride (TiN).

While the sheet resistance of the refractory metal film itself is several ohms/□, the sheet resistance of the silicide film of the refractory metal is ten and several ohms/□. The provision of the reaction preventive film can prevent a decrease in the resistance of the gate electrode 2 (word line).

Figure 3:
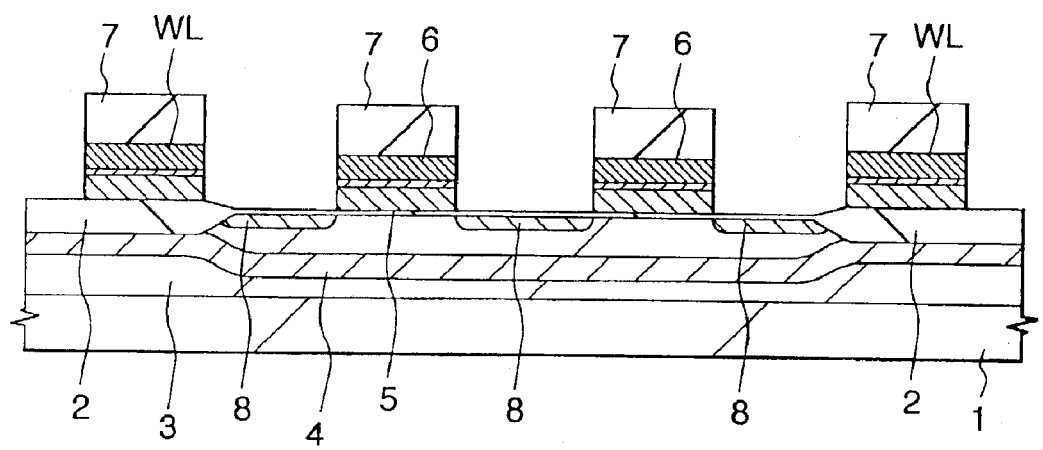

Then, as shown in FIG. 3, n type semiconductor regions 8, 8 (source region and drain region) of a memory cell selection MISFET are formed in the p type well 3 on both sides of the gate electrode 6 (word line WL) on the surface of the semiconductor substrate, 1 at a portion in which the field oxide film 2 and the gate electrode 6 are not present by ion implantation of phosphorus (P) or arsenic (As) as n type impurities to the p type well 3.

Figure 4:
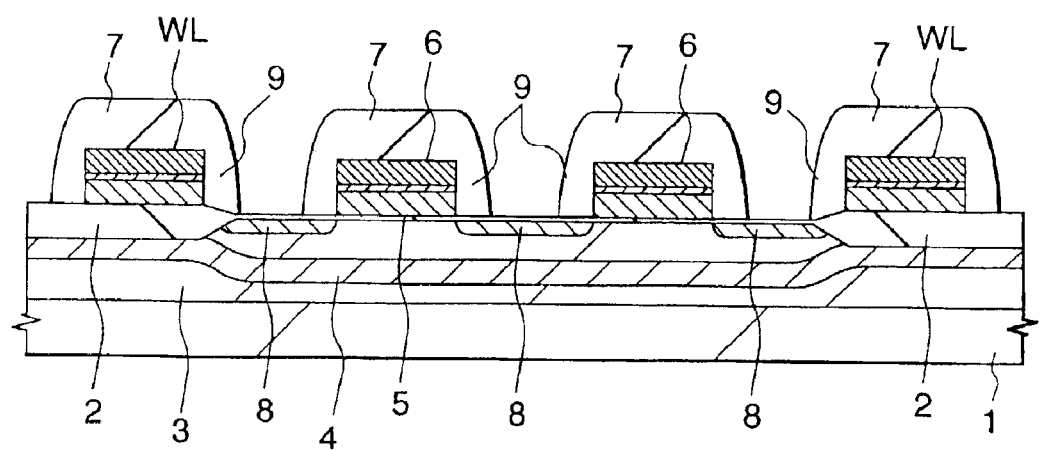

Accordingly, the n type semiconductor regions 8 are formed on both ends of the gate electrode 6 and are formed in self alignment to the gate electrode 6 and the field oxide film 2. After removing the photoresist used for the patterning of the gate electrode 6, as shown in FIG. 4, a side wall spacer 9 is formed on the side walls of the gate electrode 6 (word line WL). The side wall spacer 9 is formed by anisotropically etching the silicon nitride film deposited over the gate electrode 6 (word line WL) by a plasma CVD method.

The silicon nitride film for forming the side wall spacer 9 is also formed using identical gas and at an identical temperature as the plasma CVD method described previously.

In this embodiment, when the silicon nitride film is deposited over the gate electrode 6 (word line WL) by the plasma CVD method, oxidation on the surface of the W film exposed to the side wall of the gate electrode 6 (word line WL) is suppressed by setting the temperature in the chamber of the plasma CVD apparatus to lower than 500° C.

Since oxidation of the tungsten (W) film used for the gate electrode 6 (word line WL) proceeds remarkably at a temperature higher than 600° C., it is an effective means to form the silicon nitride film at a low temperature and to form the film in an oxygen-free atmosphere in order to prevent reduction of the resistance of the gate electrode 6 (word line WL).

Figure 5:
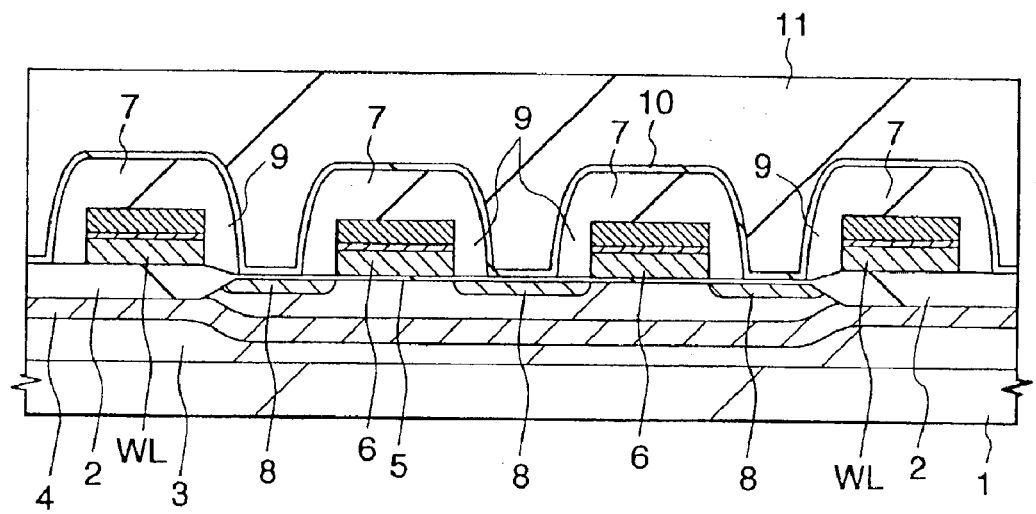

As shown in FIG. 5, after depositing a silicon oxide film 10 and a BPSG (Boron-Doped Phospho Silicate Glass) film 11 over the memory cell selection MISFET by a CVD method, the BPSG film 11 is polished by a chemical mechanical polishing (CMP) method to flatten the surface. Instead of the BPSG film, a SOG (Spin-On-Glass) film having a fluidity may be used and then the surface flattened by a chemical mechanical polishing method.

Figure 6:
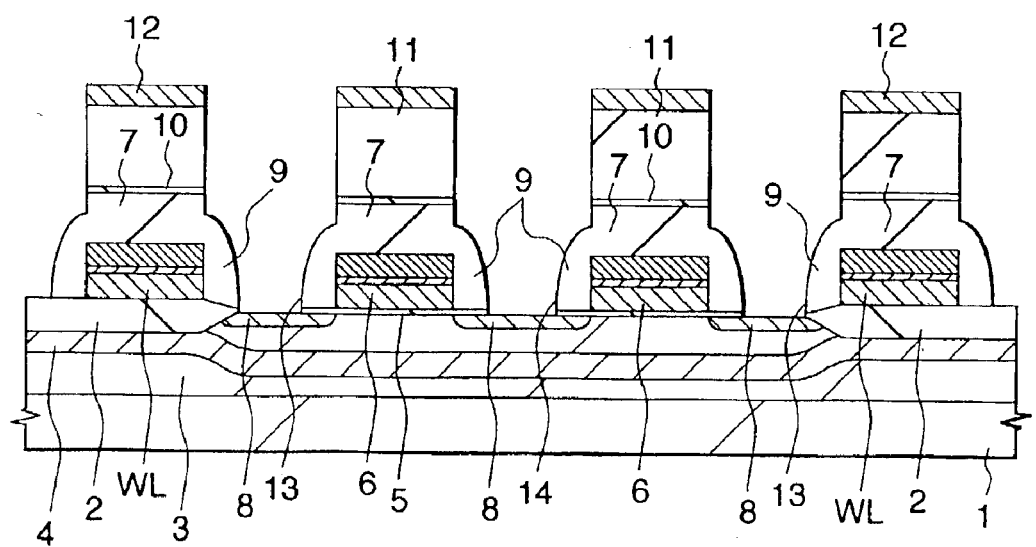

Then, as shown in FIG. 6, after depositing a polycrystal silicon film 12 on the BPSG film 11 by a CVD method, the polycrystal silicon film 12 is etched by using a photoresist as a mask and then the photoresist is removed. Next, the BPSG film 11, the silicon oxide film 10 and the gate oxide film 5 are etched by using the polycrystal silicon film 12 as a mask to form a contact hole 13 over the semiconductor region 8 so as to expose a portion of one of the source region and the drain region and form a contact hole 14 over the semiconductor region 8 so as to expose a portion of the other (n type semiconductor region 8) of the regions of the memory selection MISFET. In this case, since the silicon nitride film 7 formed over the gate electrode 6 (word line WL) and the silicon nitride formed on the side wall thereof of the memory cell selection MISFET are etched only slightly, the contact holes 13 and 14 of a fine diameter can be formed in self alignment to the side wall spacer 9, with no alignment margin between the contact hole 13 (14) and the gate electrode 6 (Word line WL).

In the etching for forming the contact holes 13 and 14, the etching rate of the silicon nitride film 7 is from $\frac{1}{20}$ to $\frac{1}{10}$ of the etching rate of the BPSG film 11 and the silicon oxide film 10.

Figure 7:
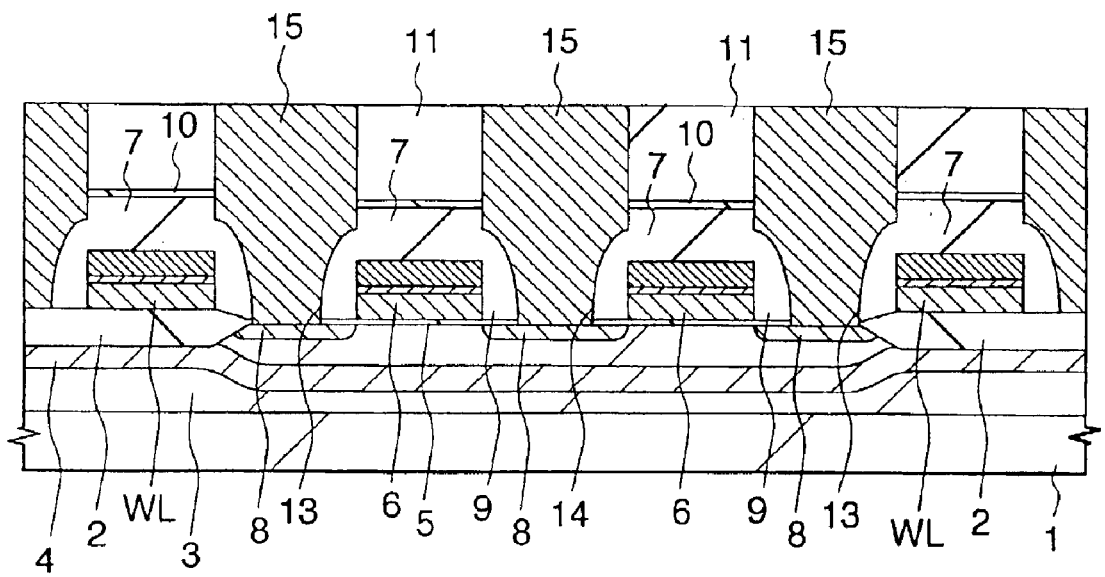

Then, as shown in FIG. 7, a plug 15 of polycrystal silicon is buried at the inside of the contact holes 13 and 14. The plug 15 is formed by depositing a polycrystal silicon film by a CVD method on the polycrystal silicon film 12 at the inside of the contact holes 13 and 14, applying etching back or chemical mechanical polishing to the deposited polycrystal silicon film and the polycrystal silicon film 12, and leaving the deposited polycrystal silicon film only at the inside of the contact holes 13 and 14. An n type impurity of phosphorus (P) or arsenic (As) is introduced into the polycrystal silicon film constituting the plug 15. The impurity is diffused through the contact holes 13 and 14 to the surface of the semiconductor substrate thereby forming a n-type semiconductor region (not illustrated) at a higher concentration than the n type semiconductor regions 8, 8. Since the semiconductor region also forms a portion of the source and the drain, the resistance of the source region and the drain region can be-reduced.

Figure 8:
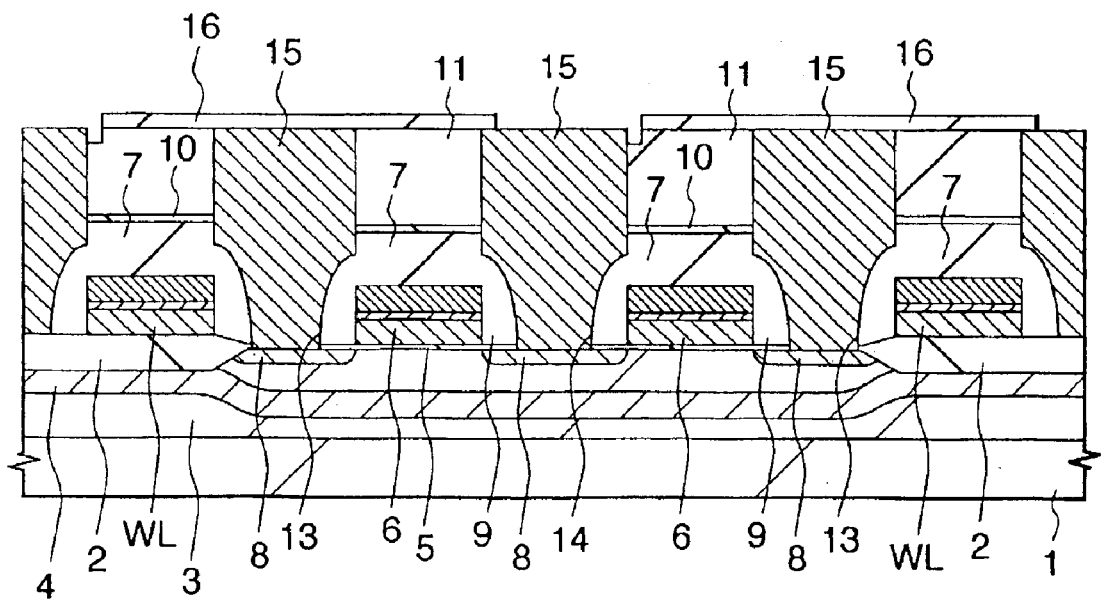
Figure 9:
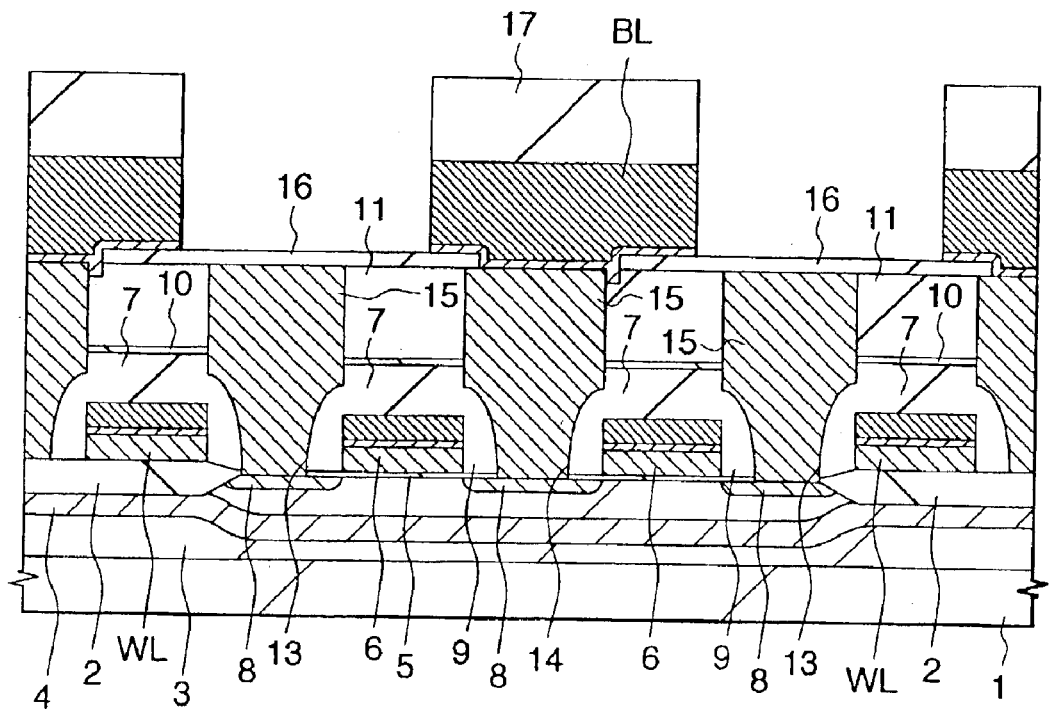

As shown in FIG. 8, a silicon oxide film 16 is deposited by a CVD method over the BPSG film 11, and then the silicon oxide film 16 over the contact hole 14 is removed by etching using a photoresist as a mask. Then, as shown in FIG. 9, a bit line BL is formed over the contact hole 14. The bit line EL is formed by depositing a titanium nitride (TiN) film and a tungsten (W) film by a sputtering method over the silicon oxide film 16, further depositing a silicon nitride film 17 as a cap insulation film by a plasma CVD method under the same conditions as those for the silicon nitride film 7 and then patterning these films by etching using a photoresist as a mask. The titanium nitride film is used for preventing a reaction from occurring between the tungsten film and the polycrystal silicon film of the plug electrode 15.

In this embodiment, when the silicon nitride film 17 is deposited by the plasma CVD method on the tungsten (W) film, oxidation on the surface of the tungsten (W) film constituting the portion of the bit line BL is suppressed by setting the temperature in the chamber of the plasma CVD apparatus to be lower than 500° C. Accordingly, a decrease of the resistance of the bit line BL can be prevented.

Figure 10:
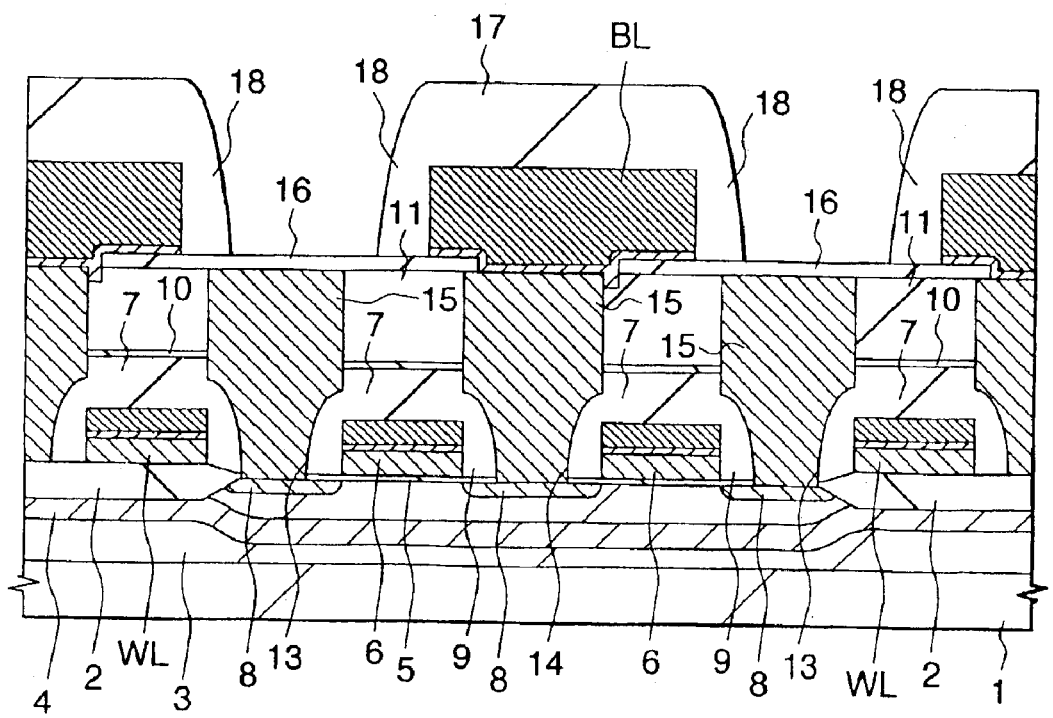

Then, as shown in FIG. 10, a side wall spacer 18 is formed on the side wall of the bit line BL. The side wall spacer 18 is formed by anisotropically etching a silicon nitride film deposited by the plasma CVD method over the bit line BL.

Figure 11:
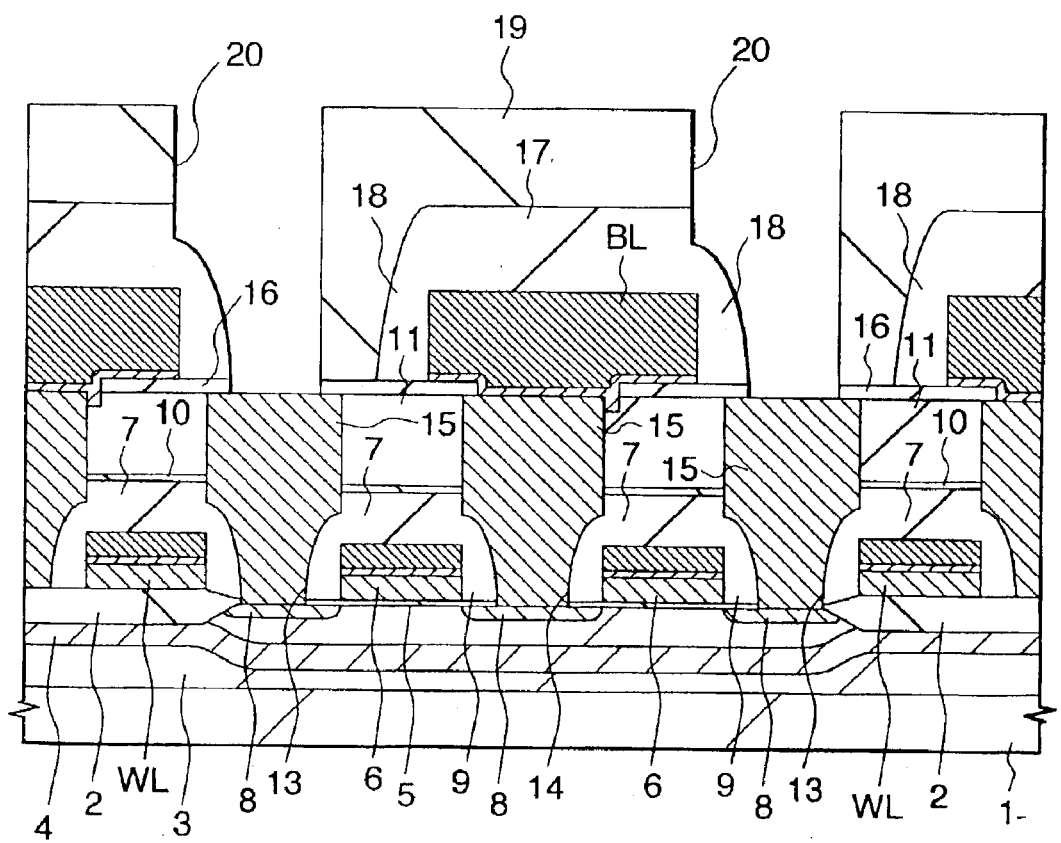

In this embodiment, the silicon nitride film is deposited over the bit line BL by a plasma CVD method under the same conditions as those for the silicon nitride film 7. Oxidation on the surface of the W film exposed to the side wall of the bit line BL is suppressed by setting the temperature in the chamber of the plasma CVD apparatus to 500° C. or lower. Then, as shown in FIG. 11, after depositing a silicon oxide film 19 over the bit line BL by a CVD process and polishing the silicon oxide film 19 by a chemical mechanical polishing method to flatten the surface thereof, the silicon oxide film 19 and the a silicon oxide film 16 are etched, using a photoresist as a mask, to form a contact hole 20 so as to expose the surface of the plug electrode 15 formed over the other (n type semiconductor region 8) of the source region and the drain region of the memory cell selection MISFET Qt. In this case, since the silicon nitride film 19 over the bit line BL and the side wall spacer 18 on the side wall serve as an etching stopper, the contact hole 20 is formed in self alignment to the side wall spacer 18 formed on the side wall of the bit line BL like that the contact holes 13 and 15.

Figure 12:
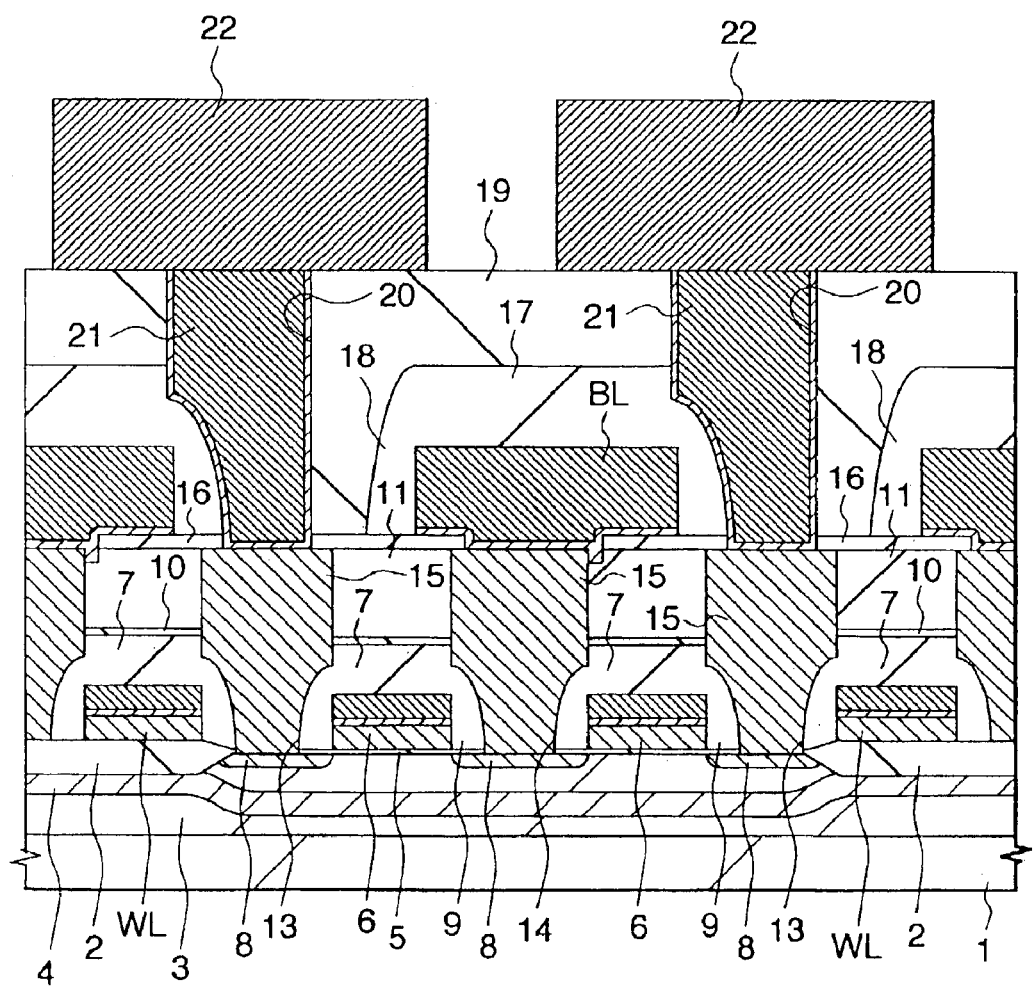

Then, as shown in FIG. 12, after burying a plug 21 to the inside of the contact hole 20, a storage electrode (lower electrode) 22 is formed over the contact hole 20. The plug 21 is formed by depositing a TiN film and a W film by a sputtering method over the silicon oxide film 19, and then etching back or applying chemical and mechanical polishing to such films. The storage electrode 22 is formed by depositing a W film over the silicon oxide film 19 by a sputtering method and then patterning the W film by etching using a photoresist as a mask.

Figure 13:
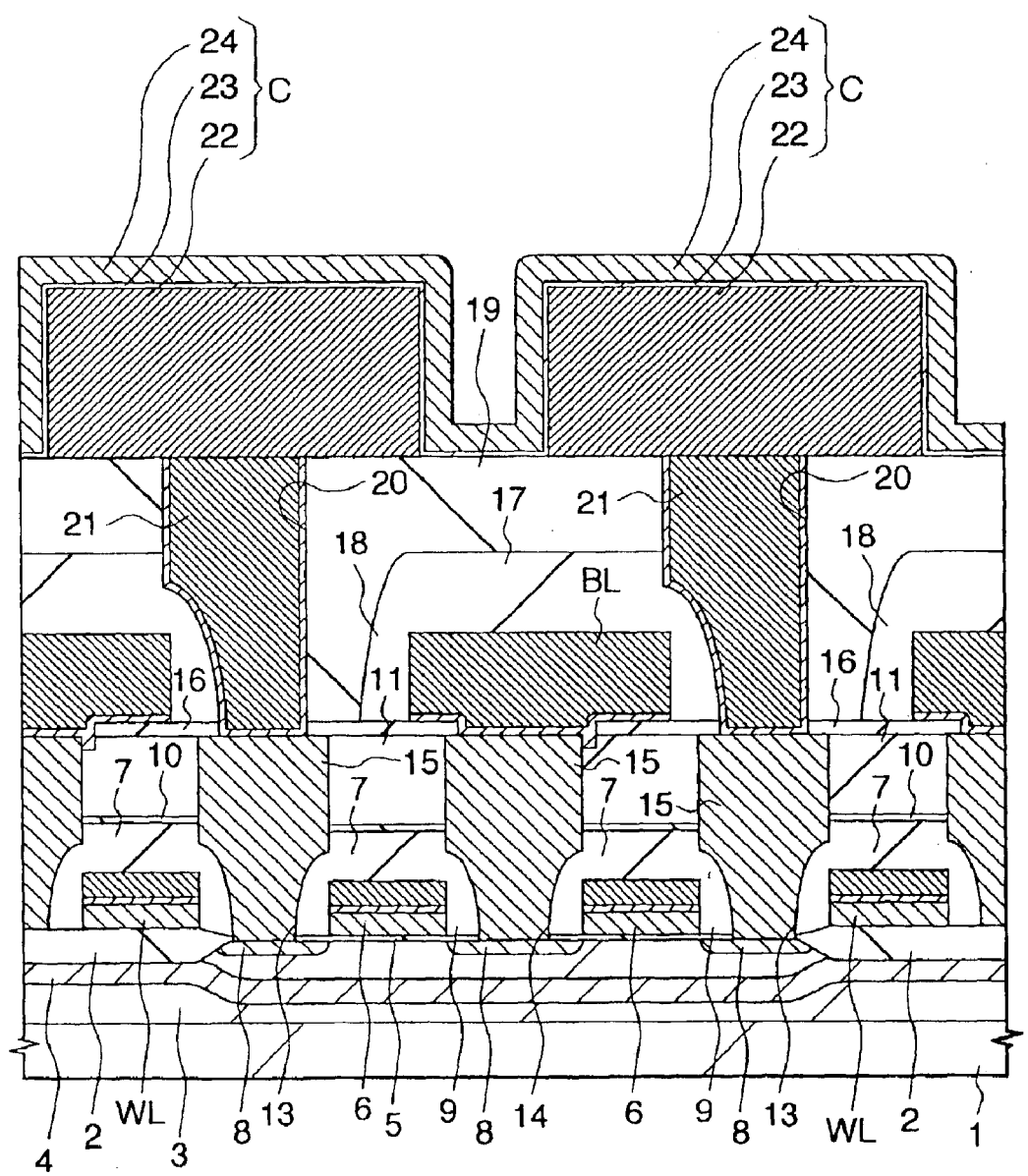

Then, as shown in FIG. 13, a capacitance insulation film 23 and a plate electrode (upper electrode) 24 are formed over the storage electrode 22. The capacitance insulation film (dielectric film) 23 and the plate electrode (upper electrode) 24 are formed simultaneously by depositing a $Ta_2O_5$ (tantalum oxide) film by a plasma CVD method over the storage electrode 22, depositing a TiN film by a sputtering method over the $Ta_2O_5$ film and then patterning the films by etching using a photoresist as a mask. Thus, an information storage capacitor C comprised of the storage electrode 22, the capacitance insulation film 23 and the plate electrode 24 is completed.

Figure 14:
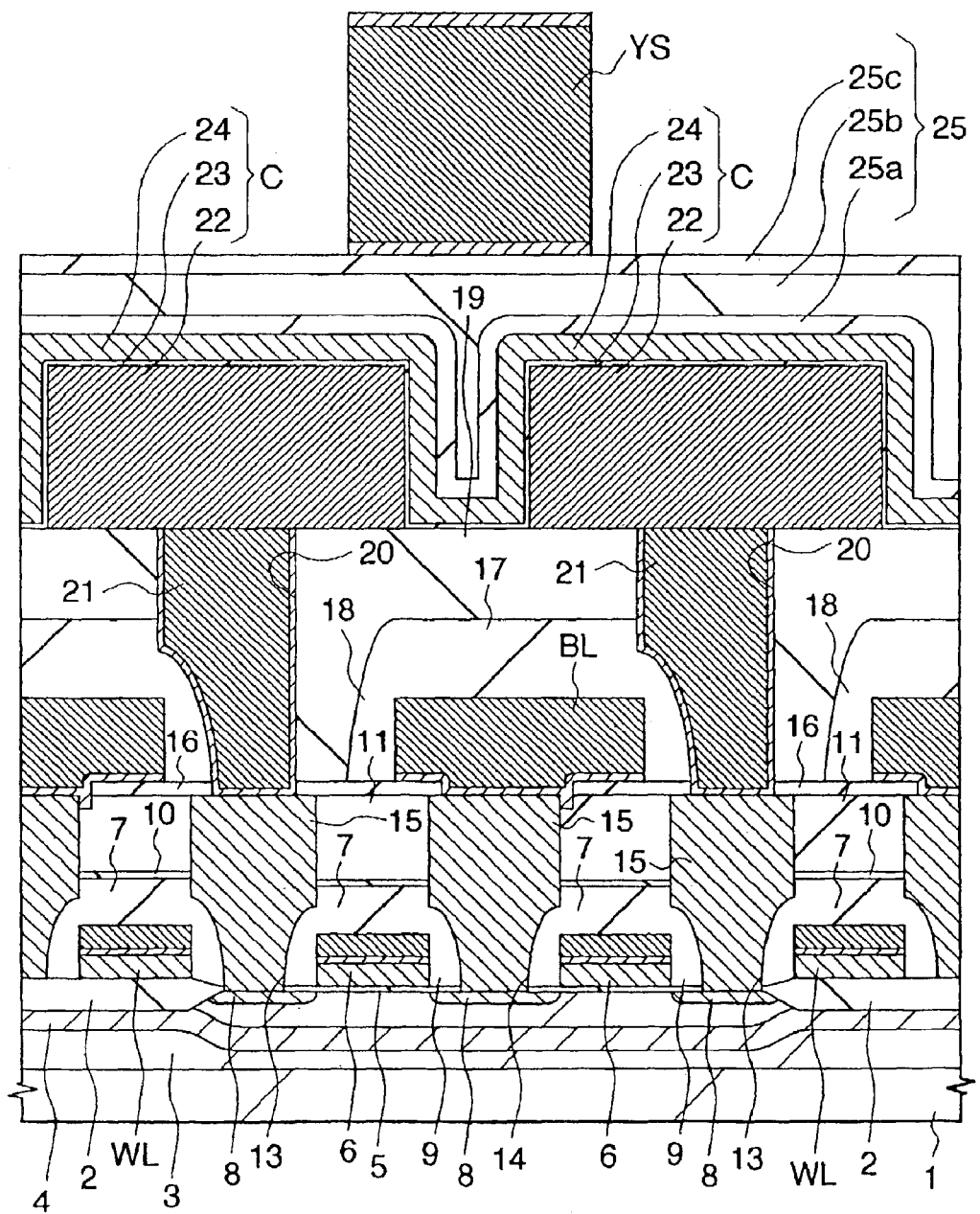

As shown in FIG. 14, after forming an interlayer insulation film 25 over the information storage capacitor C, a Y select line YS is formed on the interlayer insulation film 25. The interlayer insulation film 25 comprises a three layered film of a silicon oxide film 25a deposited by a CVD method, a spin-on-glass(SOG) film 25b deposited by a spin coating method and a silicon oxide film 25c deposited by a CVD method. The Y select line YS is formed by depositing a TiN film, an Al alloy film and a TiN film by a sputtering method on the interlayer insulation film 25 and then patterning these films by etching using a photoresist as a mask. The DRAM memory cell in this embodiment is almost completed by the steps described above.

According to the manufacturing method of this embodiment, since oxidation on the surface of the W film constituting a portion of the gate electrode 6 (word line WL) can be suppressed by depositing the silicon nitride film constituting the silicon nitride film 7 (cap insulation film) covering a portion over the gate electrode 6 (word line WL) and the side wall spacer 11 by the plasma CVD method at a low temperature of 500° C. or lower, it is possible to reduce the resistance of the gate electrode 6 (word line WL) and improve the operation speed of the DRAM.

According to the manufacturing method of this embodiment, since oxidation on the surface of the W film constituting a portion of the bit line BL can be suppressed by depositing the silicon nitride film constituting the silicon nitride film 17 (cap insulation film) covering a portion over the bit line BL and the side wall spacer 18 by the plasma CVD method at a low temperature of 500° C. or lower, it is possible to reduce the resistance of the bit line BL and improve the operation speed of the DRAM.

According to the manufacturing method of this embodiment, since the silicon nitride film 7 (cap insulation film) covering a portion over the gate electrode 6 (word line WL) and the silicon nitride film constituting the side wall spacer 11 is deposited by the plasma CVD method at a low temperature of 500° C. or lower, and the silicon nitride film constituting the silicon nitride film 17 (cap insulation film) covering a portion over the bit line BL and the side wall spacer 18 is deposited by the plasma CVD method at a low temperature of 500° C. or lower, the thermal load in the manufacturing of the DRAM can be reduced as compared with a case of depositing the silicon nitride films by a CVD method not using plasmas, at a high temperature of 700 to 800° C.

Figure 15:
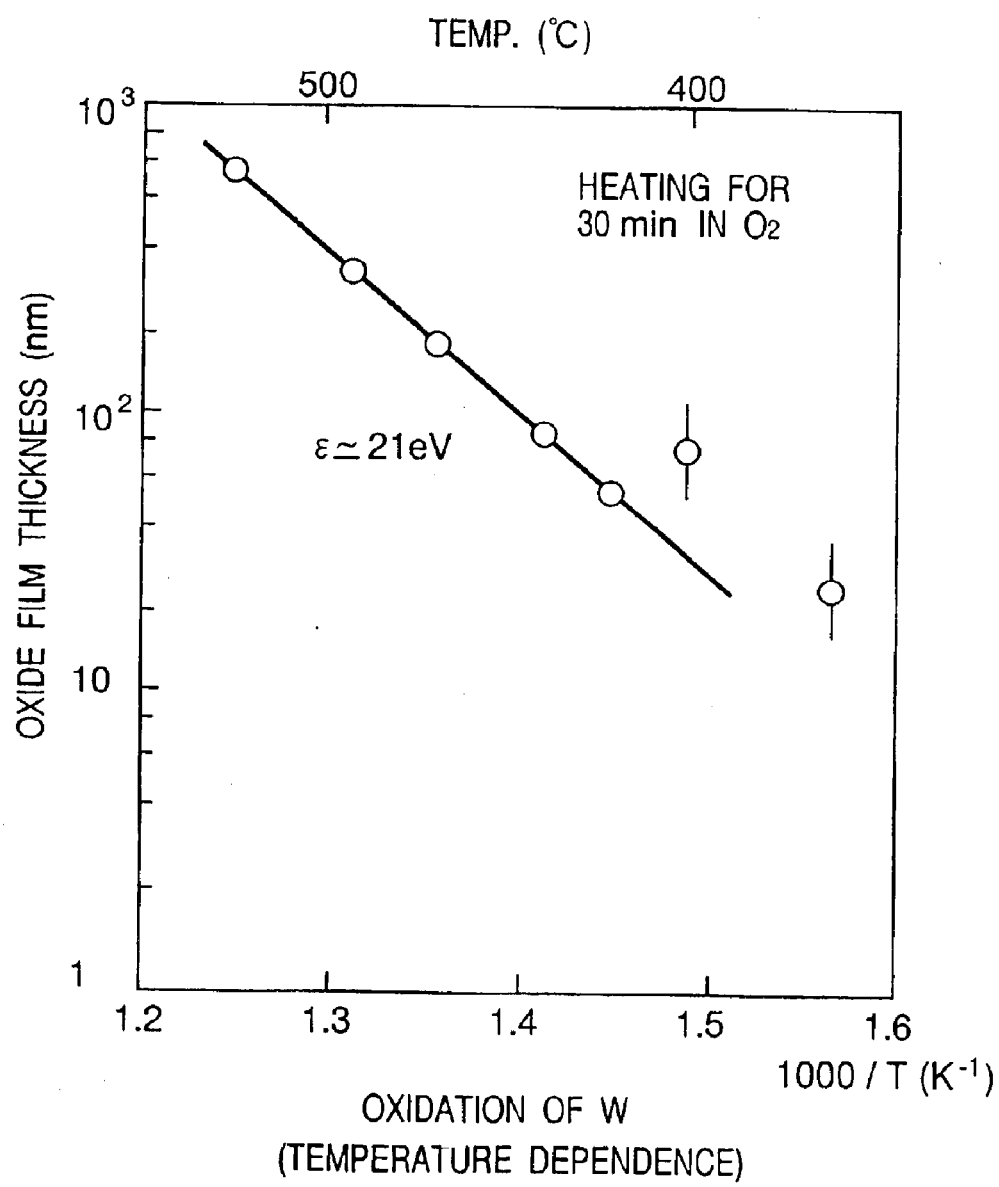
FIG. 15 is a graph showing temperature dependence the oxidation of W.
Figure 16:
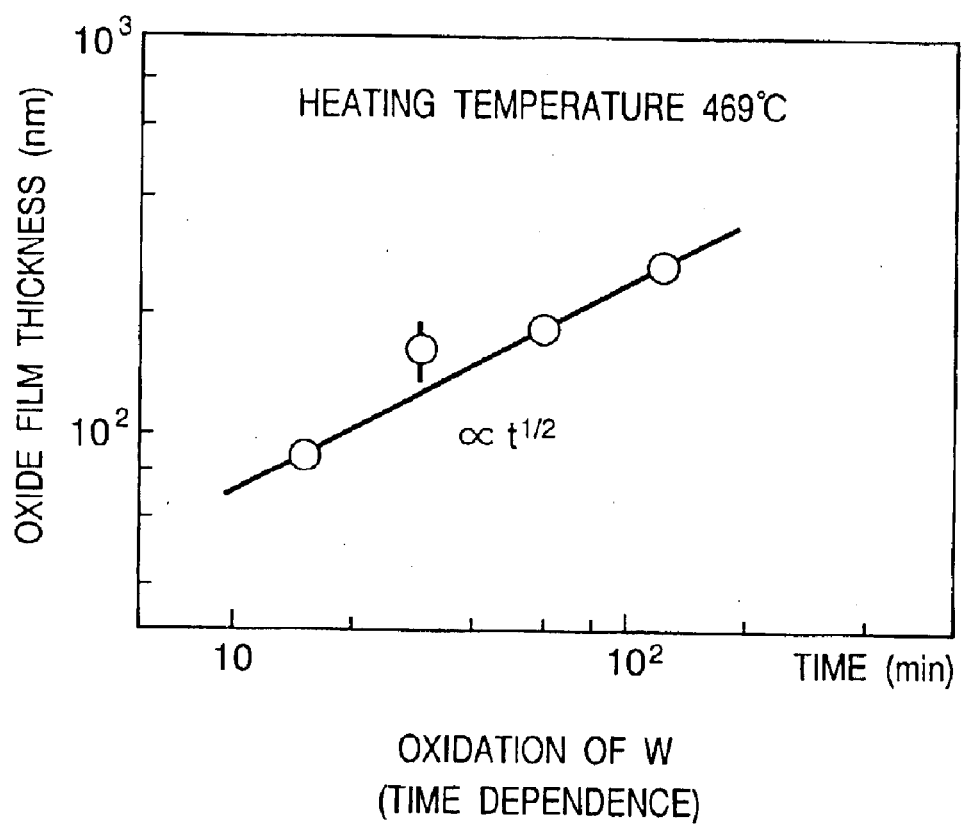
FIG. 16 is a graph showing time dependence of the oxidation of W.

FIG. 15 is a graph illustrating the temperature dependence of tungsten (W) oxidation in an oxygen atmosphere and FIG. 16 is a graph illustrating a time dependence (temperature= 469° C.) of tungsten (W) oxidation. As shown in the graphs, when the tungsten (W) film is exposed to a high temperature atmosphere containing oxygen, an oxide film is formed on the surface. The thickness of the oxide film is increased substantially in proportion with temperature and time.

Then, in this embodiment, when the silicon nitride film 7 is deposited on the tungsten (W) film by the plasma CVD method, oxidation on the surface of the tungsten (W) film constituting a portion of the gate electrode 6 (word line WL) is suppressed by setting the temperature in the chamber of the plasma CVD apparatus to 500° C. or lower.

In this embodiment, when the silicon nitride film 7 is deposited on the tungsten (W) film, the silicon nitride film 7 can be formed at a lower temperature by conducting the deposition using the plasma CVD method, as compared with a case of not using plasmas.

Further, since the silicon nitride film 7 can be formed at a temperature of 500° C. or lower, which is lower than 600° C. at which oxidation of tungsten (W) film becomes conspicuous, oxidation on the surface of the tungsten (W) film can be reduced as much as possible.

Further, since the apparatus itself for the plasma CVD method has a feature of less involving oxygen as compared with the CVD apparatus not using plasmas, it can be said that the surface of the tungsten (W) film is less oxidized.

While an explanation has been made of an example relating to the silicon nitride film 7, the situation is also identical for other silicon nitride films in this such as, for example, the silicon nitride film 9, the silicon nitride film 17 and the silicon nitride film 18.

Embodiment 2

This embodiment is different from the Embodiment 1 described above in that the silicon nitride film is changed from a single layer film formed by the plasma CVD method into a laminate film comprising a silicon nitride film formed by a plasma CVD method and a silicon nitride film formed by a CVD method not using plasmas.

Accordingly, since other factors are identical with those in Embodiment 1, the explanation for Embodiment I can be referred to in this embodiment.

Figure 17:
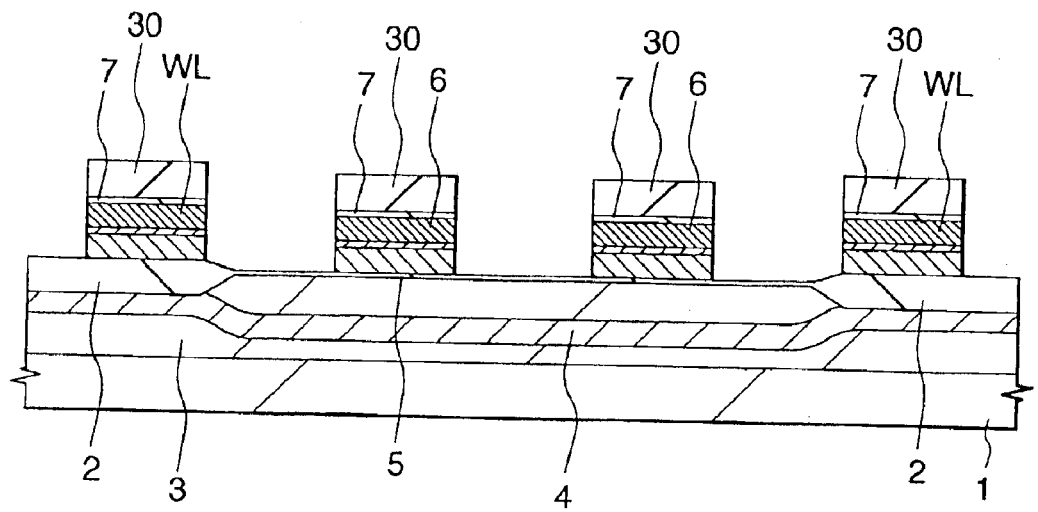
FIG. 17 to FIG. 24 are cross sectional views of a main portion of the semiconductor substrate illustrating sequential steps of a method of manufacturing a DRAM representing an Embodiment 2 according to the present invention.

In the method of manufacturing a DRAM memory cell in this embodiment, a gate electrode 6 (word line WL) of a memory cell selection MISFET is at first formed on the p type well 3 as shown in FIG. 17.

The gate electrode 6 (word line WL) is formed with a laminate film comprising a polycrystal silicon film, a TIN film and a W film like that in Embodiment I. On the other hand, a cap insulation film over the gate electrode 6 (word line WL) is formed with a laminate film comprising the silicon nitride film 7 deposited by the plasma CVD and a silicon nitride film 30 deposited by a CVD method not using plasmas and a temperature of at 700 to 800° C.

When the silicon nitride film 7 is formed, the temperature in the chamber of the plasma CVD apparatus is set to 500° C. or lower to suppress oxidation on the surface of the W film constituting a portion of the gate electrode 5 (word line WL) like that in Embodiment I. On the other hand, a silicon nitride film 30 is deposited by using, as reaction gases, monosilane ($SiR_4$) and ammonia ($NH_3$) or dichlorosilane ($SiCl_2H_2$) and ammonia ($NH_3$) by a CVD method not using plasmas and under a temperature condition from 700 to 800° C., and the film 30 is deposited at a greater film thickness as compared with the silicon nitride film 7. When the silicon nitride film 30 is deposited, since the surface of the W film is covered with the silicon nitride film 7, there is no fear that the surface of the W film will be oxidized even if the film is formed at a high temperature of 700 to 800° C.

Figure 18:
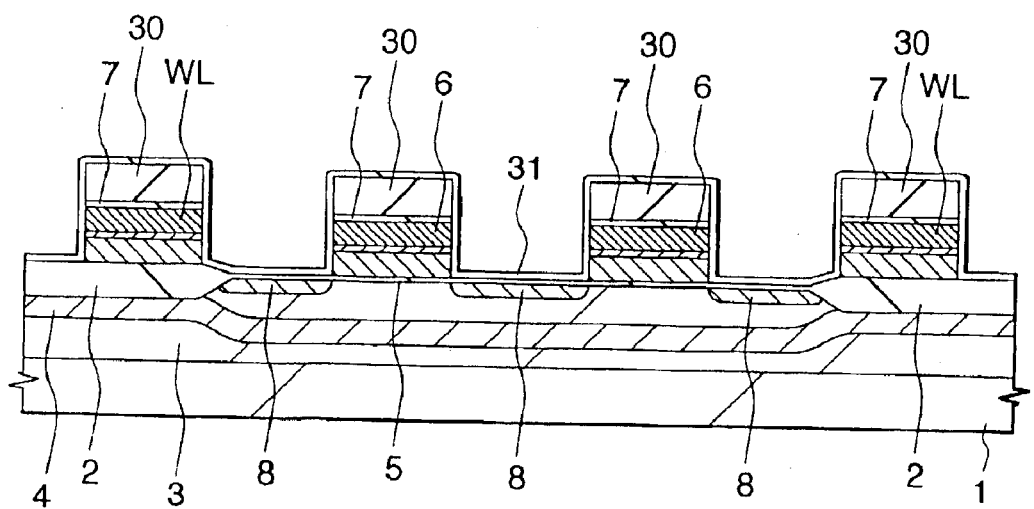

Then, as shown in FIG. 18, after forming n type semiconductor regions 8 and 8 (source region and drain region) of a memory cell selection MISFET in p type wells 3 on both sides of the gate electrode 6 (word line WL) by ion implantation of the n type impurity phosphorus (P) in the p type well a silicon nitride film 31 is deposited over the gate electrode 6 (word line WL) by a plasma CVD method. When the silicon nitride film 31 is deposited, like that in the Embodiment I, the temperature in the chamber of the plasma CVD apparatus is set to 500° C. or lower, and oxidation on the surface of the W film exposed to the side wall of the gate electrode 6 (word line WL) is suppressed.

Figure 19:
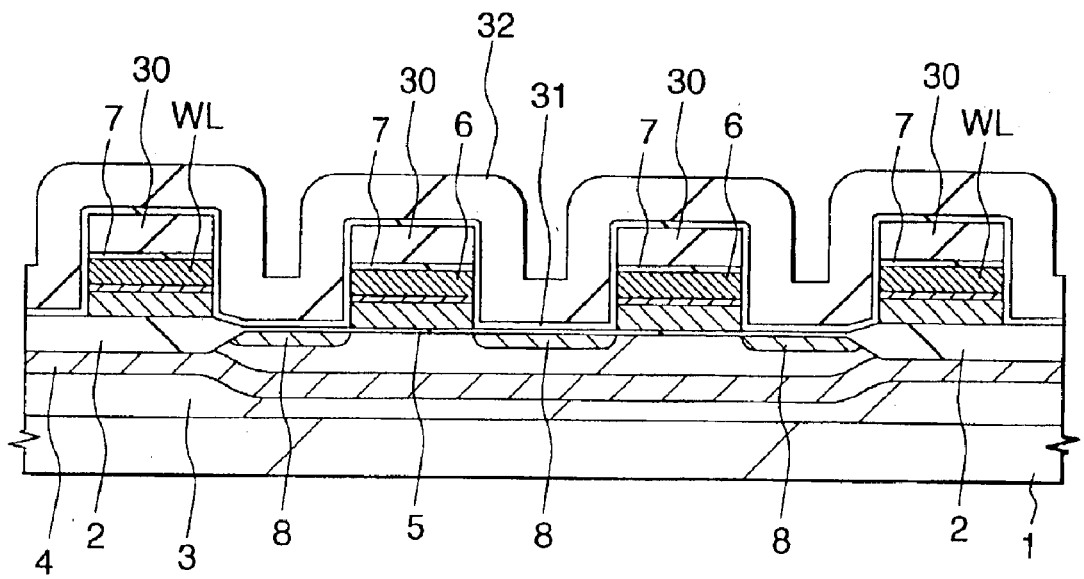

As shown in FIG. 19, a silicon nitride film 32 is deposited on the silicon nitride film 31. The silicon nitride film 32 is deposited by using reaction gases like that in the silicon nitride film 30 by a CVD method not using plasmas under the temperature condition from 700 to 800° C., and the film 32 is deposited to a thickness larger than that of the silicon nitride film 31. When the film 32 is deposited, since the side wall of the gate electrode 6 (word line WL) is covered with the silicon nitride film 7, there is no fear of oxidation on the surface of the W film.

Figure 20:
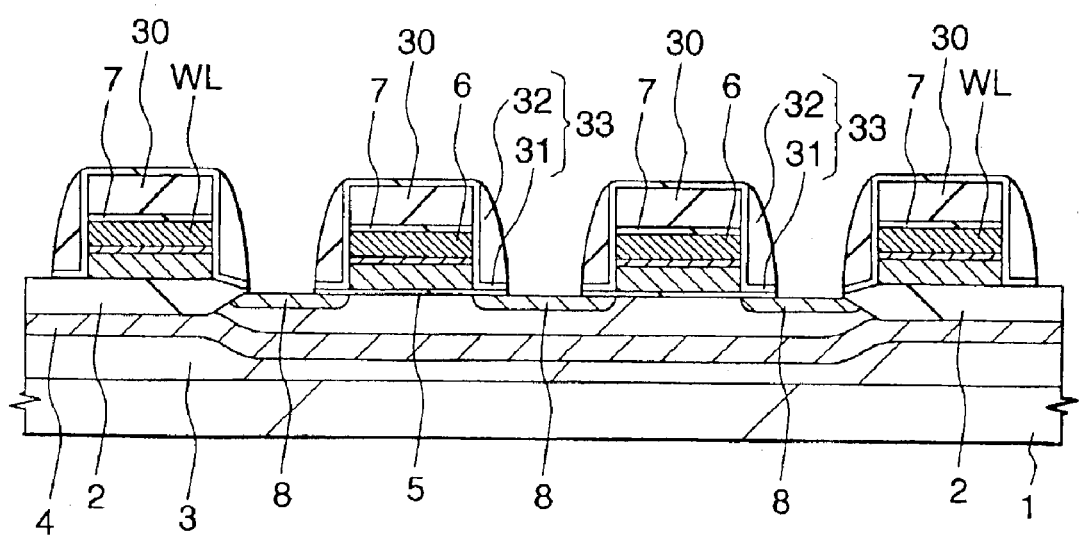

Then, as shown in FIG. 20, the silicon nitride film 31 and the silicon nitride film 32 are anisotropically etched to form a side wall spacer 33 on the side wall of the gate electrode 6 (word line WL).

Figure 21:
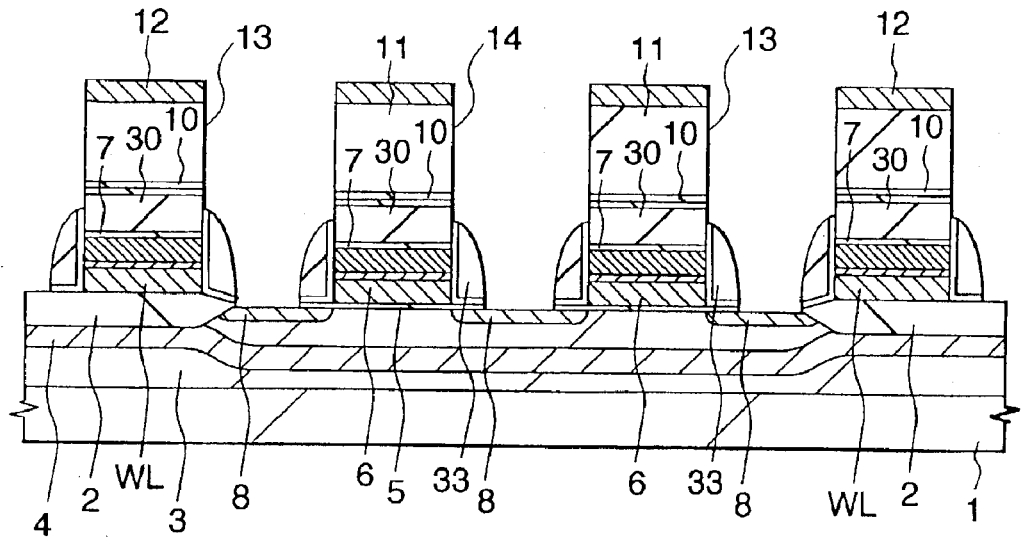

Then, as shown in FIG. 21, after depositing a silicon oxide film 10 and a BPSG film 11 by a CVD method over the memory cell selection MISFET, and polishing the EPSG film 11 by a chemical and mechanical polishing (CMP) to flatten the surface thereof, a polycrystal silicon film 12 is deposited on the EPSG film by a CVD method, the polycrystal silicon film 12 is etched by using a photoresist as a mask and then the photoresist is removed. Then, the EPSG film 11, the silicon oxide film 10 and the gate oxide film 5 are etched by using the polycrystal silicon film 12 as a mask to thereby forming a contact hole 13 on one of the source region and the drain region (n type semiconductor region 8) while forming a contact hole 14 over the other of them (n type semiconductor region 8) of the memory cell selection MISFET. Since the side wall spacer 33 on the side wall of the gate electrode 6 (word line WL) functions as an etching stopper, the contact holes 13 and 14 are formed in self alignment to the side wall spacer 33 like that in Embodiment 1.

Figure 22:
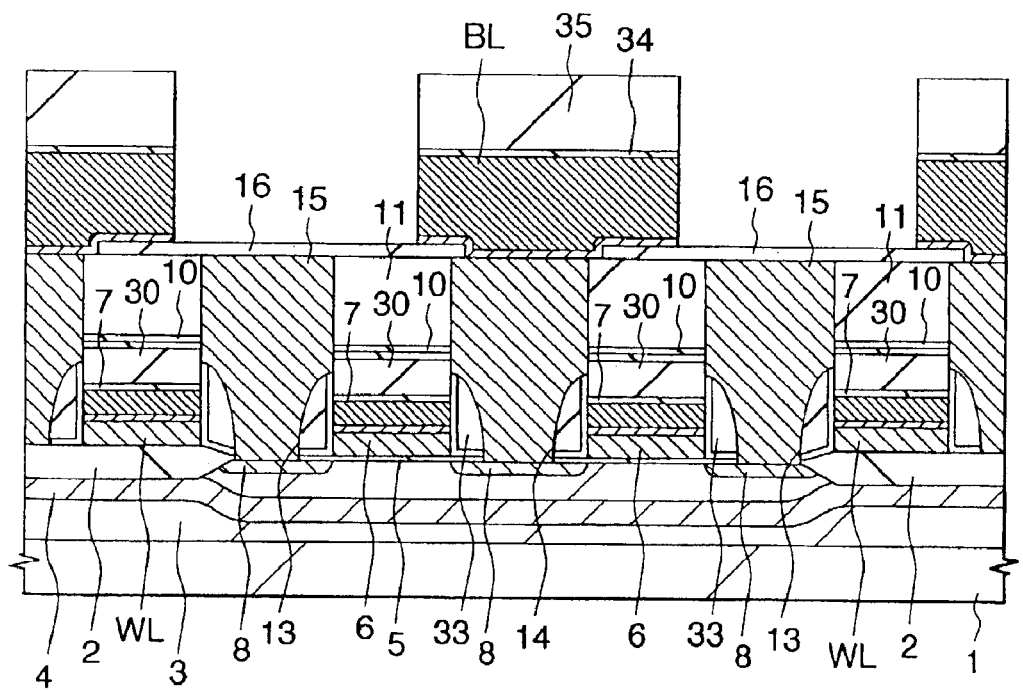

Then, as shown in FIG. 22, after burying a plug 15 of polycrystal silicon to the inside of the contact holes 13 and 14, a silicon oxide film 16 is deposited over the EPSG film 11 by a CVD method and, after removing the silicon oxide film 16 over the contact hole 14 by etching using a photoresist as a mask, a bit line BL is formed over the contact hole 15.

The bit line BL is formed by depositing a TiN film and a W film by a sputtering method over the silicon oxide film 16, then depositing a cap insulation film over the W film and then patterning the films by etching using a photoresist as a mask. The cap insulation film over the bit line BL is formed by using a laminate film comprising a silicon nitride film 34 deposited by a plasma CVD method like that the silicon nitride film 7, and a silicon nitride film 35 deposited by a CVD method not using plasmas like that the silicon nitride film 30.

When the silicon nitride film 34 is deposited, like that in Embodiment I described above, the temperature in the chamber of the plasma CVD apparatus is set to 500° C. or lower thereby suppressing oxidation on the surface of the W film constituting a portion of the bit line BL. On the other hand, a silicon nitride film 35 is deposited by a CVD method not using plasmas and under the temperature condition of from 700 to 800° C., and the film 35 is deposited to a thickness greater than that of the silicon nitride film 34. When the silicon nitride film 35 is deposited, since the surface of the W film is covered with the silicon nitride film 34, there is no fear of oxidation on the surface of the W film even if the film is formed at a high temperature of 700 to 800° C.

Figure 23:
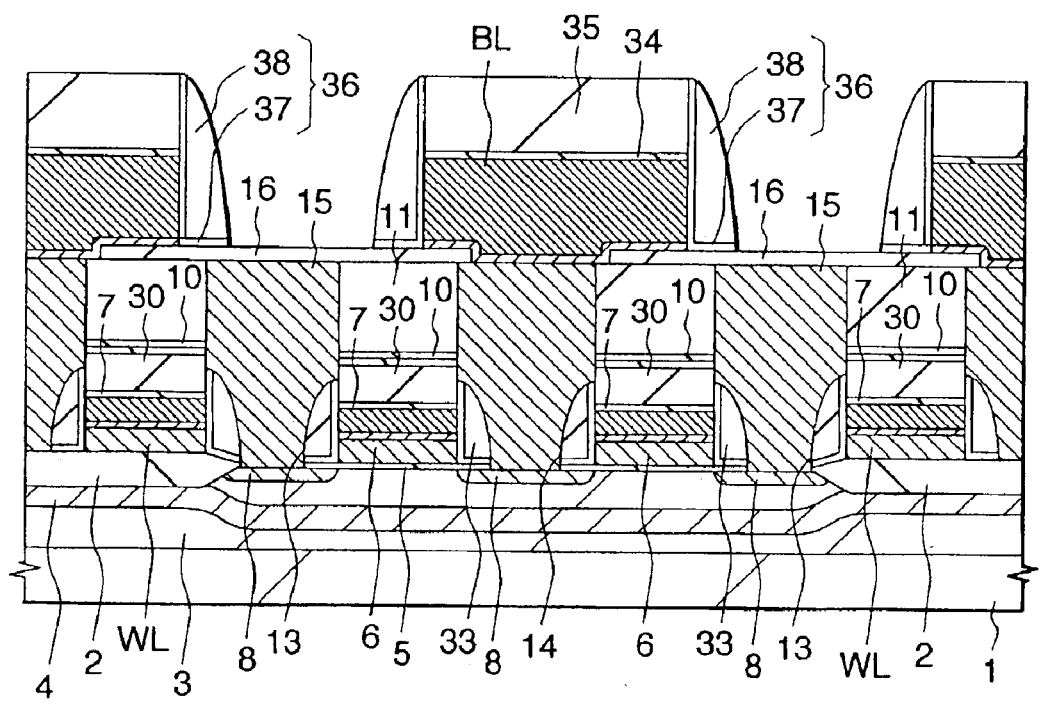

Then, as shown in FIG. 23, a side wall spacer 36 is formed on the side wall of the bit line BL. The side wall spacer 36 is formed by depositing a silicon nitride film 37 by a plasma CVD method over the bit line BL, depositing a silicon nitride film 38 by a CVD method not using plasma over the silicon nitride film 37 and then fabricating the silicon nitride film 37 and the silicon nitride film 38 by anisotropic etching.

When the silicon nitride film 34 is deposited, like that in Embodiment I described above, the temperature in the chamber of the plasma CVD apparatus is set to 500° C. or lower thereby suppressing oxidation on the surface of the W film constituting a portion of the bit line BL. On the other hand, a silicon nitride film 35 is deposited by a CVD method not using plasmas and under the temperature condition of from 700 to 800° C. and the film 35 is deposited to a thickness greater than that of the silicon nitride film 34. When the silicon nitride film 35 is deposited, since the surface of the W film is covered with the silicon nitride film 34, there is no fear of oxidation on the surface of the W film even if the film is formed at a high temperature of 700 to 800° C.

Figure 24:
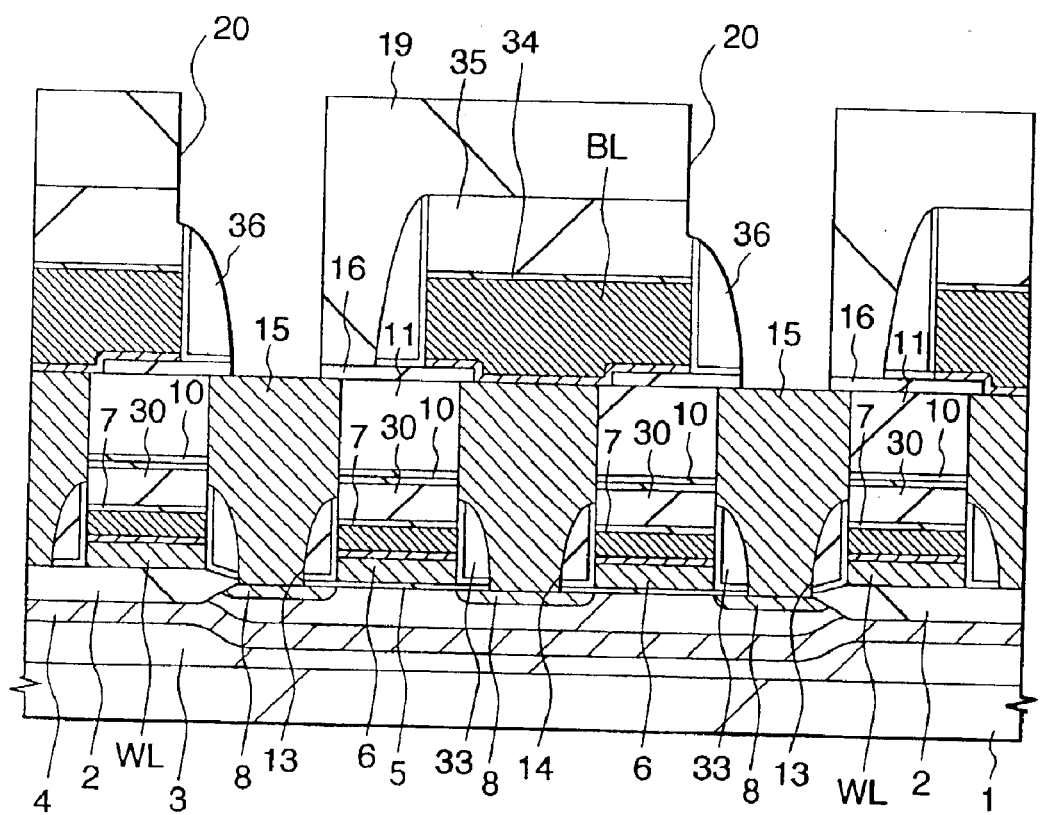

Then, as shown in FIG. 24, after polishing a silicon nitride film 19 deposited over the bit line EL by a CVD method using a chemical mechanical polishing (CMP) method to flatten the surface, the silicon oxide film 19 and the silicon oxide film 16 are etched by using a photoresist as a mask to form a contact hole 20 so as to expose the surface of the plug electrode 15 formed over the other of the source region and the drain region (n type semiconductor region 8) of a memory cell selection MISFET Qt. In this case, since the side wall spacer 36 on the side wall of the bit line BL functions as an etching stopper, the contact hole 20 is formed by self alignment to the side wall spacer 36. Subsequent steps are identical with those in Embodiment I.

According to the manufacturing method of this embodiment, since oxidation on the surface of the tungsten (W) film constituting a portion of the gate electrode 6 (word line WL) can be suppressed, it is possible to reduce the resistance of the gate electrode 6 (word line WL) and improve the operation speed of the DRAM like that in Embodiment 1.

Further, since the cap insulation film covering the portion over the gate electrode 6 (word line WL) is formed with a laminate film comprising the silicon nitride film 7 and the silicon nitride film 30 having an etching selectivity to the silicon oxide film which is higher than that of the silicon nitride film 7, and the side wall spacer 33 is formed with a laminate film comprising the silicon nitride film 31 and the silicon nitride 32 having an etching selectivity to the silicon oxide film which is higher than that of the silicon nitride film 31, the contact holes 13 and 14 can be formed at a higher accuracy as compared with Embodiment I described above.

Figure 25:
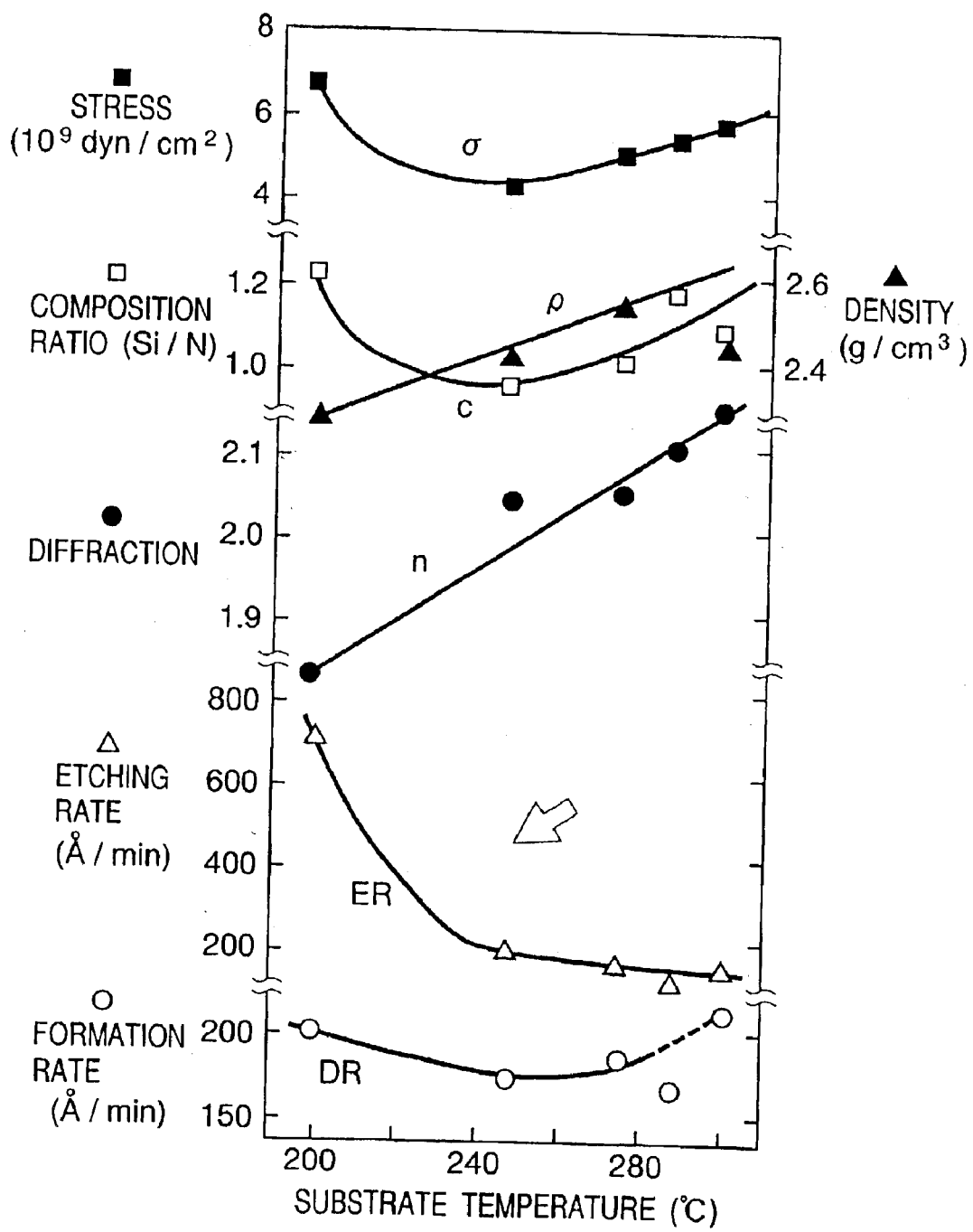
FIG. 25 is a graph illustrating a relation between the film-forming temperature and the etching speed of a silicon nitride film.

As shown in FIG. 25 (abstracted from "Thin Film Handbook" issued by OHM Co.), if the film forming temperature for the silicon nitride film is excessively low, the etching rate is increased and the etching selectivity relative to the silicon oxide film is reduced.

That is, in the Embodiment 2, oxidation of the tungsten (W) as the material for the gate electrode 6 (word line) is prevented by the silicon nitride film formed by the plasma CVD method, while the etching selectivity to the silicon oxide film is ensured by the silicon nitride film formed by the CVD method not using plasmas.

According to the manufacturing method of this embodiment, since oxidation on the surface of the tungsten (W) film constituting a portion of the bit line EL can be suppressed, it is possible, like that in Embodiment 1, to reduce the resistance of the bit line EL and improve the operation speed of the DRAM.

Further, according to the manufacturing method of this embodiment, since the cap insulation film covering the portion over the bit line BL is formed with a laminate film comprising the silicon nitride film 34 and the silicon nitride film 35 having a higher etching selectivity to the silicon oxide film than that of the silicon nitride film 34, and the side wall spacer 35 is formed with a laminate film comprising the silicon nitride film 37 and the silicon nitride film 38 having a higher etching selectivity relative to the silicon oxide film than that of the silicon nitride film 37, the contact hole 20 can be formed at a higher accuracy compared with that in Embodiment 1.

According to this embodiment, since the silicon nitride film formed by the CVD method not using plasmas is disposed to the cap insulation film covering the portion over the gate electrode 6 (word line) and the bit line, and the side wall spacer covering the side wall, the leakage current through the gate electrode 6 (word line) and the bit line can be decreased as compared with Embodiment 1.

This is because the film quality of the silicon nitride film formed at a low temperature is poor compared with the film quality of the silicon nitride film formed at a high temperature.

Since the cap insulation film covering the portion over the gate electrode 6 (word line) and the bit line, and the side wall spacer covering the side wall comprises a dual layer structure of the silicon nitride film formed by the plasma CVD and the silicon nitride film formed by the CVD method not using plasmas, the following three advantageous effects can be obtained.

(1) Increase of the resistance of the gate electrode (word line) can be prevented.

(2) Etching selectivity relative to the oxide film can be increased more.

(3) Leak current through the gate electrode (word line) and the bit line can be decreased.

Embodiment 3

Figure 26:
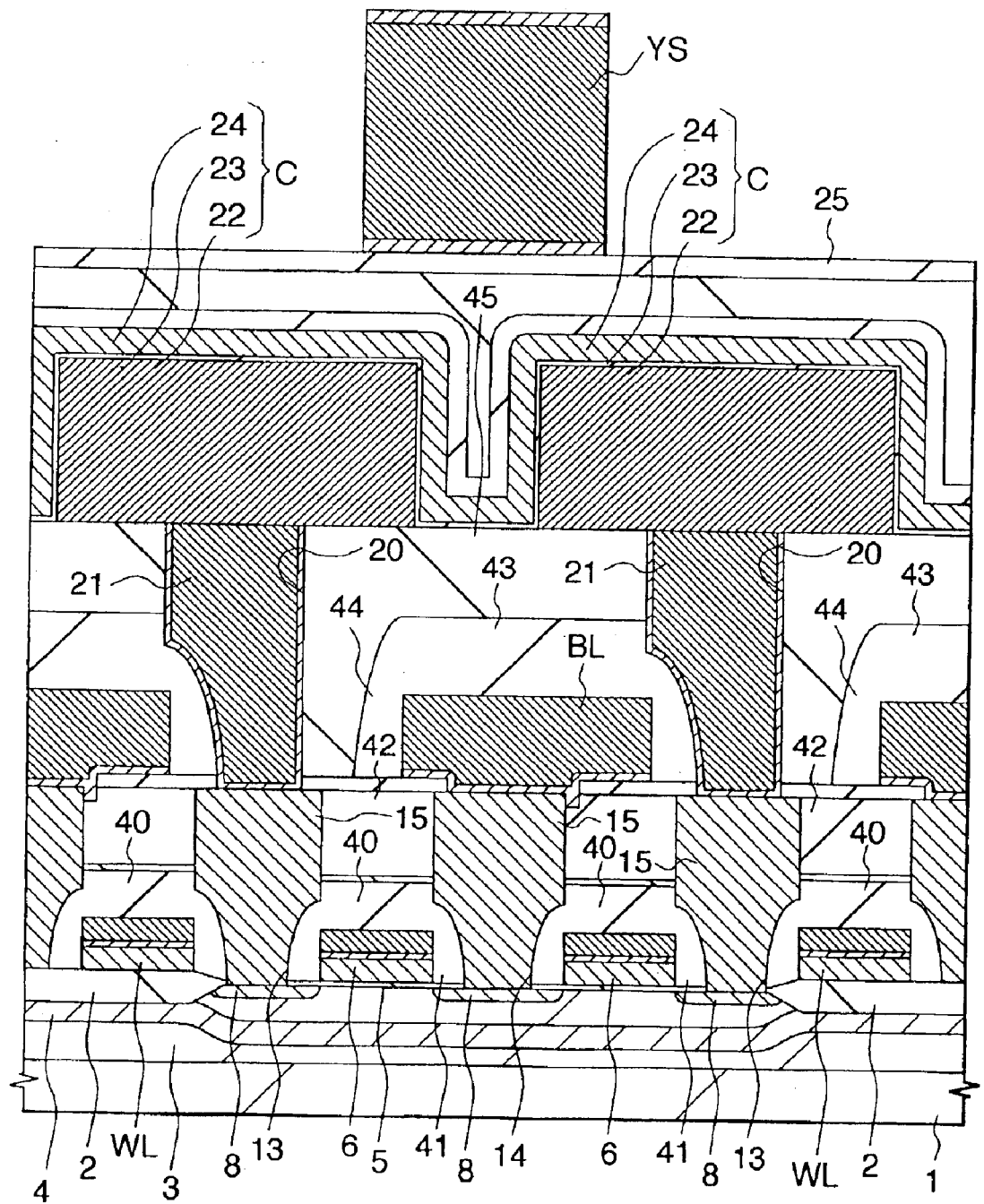
FIG. 26 is a cross sectional view of a main portion of the semiconductor substrate for illustrating a method of manufacturing a DRAM representing an Embodiment 3 according to the present invention.

FIG. 26 is a cross sectional view of a main portion of a semiconductor substrate illustrating a method of manufacturing a DRAM memory cell in this embodiment.

This embodiment is different from Embodiment I at first in that the cap insulation film covering a portion over the gate electrode 6 (word line WL) is constituted with a silicon oxide film 40, a side wall spacer 41 is constituted with a silicon oxide film, and an insulation film over a cap insulation film (silicon oxide film) 40 is constituted with a silicon nitride film 42. The silicon oxide film 40 constituting the cap insulation film and the silicon oxide film constituting the side wall spacer 41 are deposited while setting the temperature in the chamber of the plasma CVD apparatus to 500° C. or lower for suppressing oxidation on the surface of the W film constituting a portion of the gate electrode 6 (word line WL).

In this case, the silicon oxide film used as the cap insulation film and the side wall spacer is, for example, a TEOS film formed by a plasma CVD method. The TEOS film can be formed by bubbling TEOS (tetraethoxy silane: $(C_2H_2O)_4Si$) with a He carrier gas and supplying the same into a furnace of a plasma CVD apparatus at about 400° C.

Next, this embodiment is different from Embodiment 1 in that the cap insulation film covering a portion over the bit line BL is constituted with a silicon oxide film 43, a side wall spacer 44 is constituted with a silicon oxide film and an insulation film at a portion over the cap insulation film (silicon oxide film 43) is constituted with a silicon nitride film 45. The silicon oxide film 43 constituting the cap insulation film and the silicon oxide film constituting the side wall spacer 44 are deposited while setting the temperature in the chamber of the plasma CVD apparatus to 500° C. or lower for suppressing oxidation on the surface of the W film constituting a portion of the bit line BL. As the silicon oxide film, the TEOS film described above is used.

That is, in the manufacturing method of this embodiment, when contact holes 13 and 14 are formed by etching the silicon oxide film 42 at a portion over the gate electrode 6 (word line WL), the contact holes 13 and 14 are formed by self alignment using the silicon oxide film 40 (cap insulation film) covering the portion over the gate electrode 6 (word line WL) and the side wall spacer 41 of the silicon oxide as an etching stopper. Further, when the contact hole 20 is formed by etching the silicon nitride film 45 over the bit line BL, the contact hole 20 is formed by self alignment to the side wall spacer 44 by using the silicon oxide film 43 (cap insulation film) covering the portion over the bit line BL and the side wall spacer 44 of silicon oxide as an etching stopper.

According to the manufacturing method of this embodiment, since it is possible to suppress oxidation on the surface of the W film constituting a portion of the gate electrode 6 (word line WL) and suppress oxidation on the surface of the W film constituting a portion of the bit line BL, the resistance of the gate electrode 6 (word line WL) and the bit line BL can be reduced to improve the operation speed of the DRAM like those in the Embodiments I and 2.

Further, according to the manufacturing method of this embodiment, since the cap insulation film and the side wall spacer surrounding the gate electrode 6 (word line WL) are constituted with a silicon oxide film having a dielectric constant lower than that of the silicon nitride film, and the cap insulation film surrounding the bit line EL and the side wall spacer are constituted with a silicon oxide film having a lower dielectric constant than that of the silicon nitride film, the parasitic capacitance of the gate electrode 6 (word line WL) and the parasitic capacitance of the bit line BL can be decreased, so that the operation speed of the DRAM can be improved further.

While the features of the present invention have been explained concretely with reference to various embodiments, the present invention is not restricted only to such embodiments but can be varied within a range not departing the gist thereof.

For example, in Embodiment 3, while the cap insulation film covering the portion over the gate electrode (word line) is constituted with the silicon oxide film deposited at a temperature of 500° C. or lower, the side wall spacer is constituted with a silicon oxide film deposited at a temperature of 500° C. or lower, and the insulation film over the cap insulation film is constituted with the silicon nitride film, the insulation film may also be constituted with a laminate film comprising a silicon nitride film and a silicon oxide film. That is, when the silicon oxide film over the gate electrode (word line) is etched to form a contact hole, the silicon nitride film under the silicon oxide film may be used as an etching stopper and the contact hole may be formed by self alignment. In this case, since the silicon nitride film is deposited at a high temperature from 700 to 800° C., the etching selectivity of the silicon nitride film relative to the silicon oxide film can be increased.

Since the insulation film on the portion over the cap insulation film is constituted with a laminate film comprising the silicon nitride film and the silicon oxide film having a smaller stress in the film, the stresses of the insulation film exerted on the gate electrode (word line) can be decreased as compared with the case of constituting the insulation film only with the silicon nitride film, so that the reliability of the gate electrode (word line) can be improved.

In the same manner, since the insulation film over the cap insulation film covering the portion over the bit line is constituted with a laminate film comprising the silicon nitride film and the silicon oxide film having a smaller stress in the film, the stresses of the insulation film exerted on the bit line can be reduced as compared with the case of constituting the insulation film only with the silicon nitride film, so that the reliability of the bit line can be improved.

For example, in Embodiment 2, the cap insulation film and the side wall spacer for the gate electrode (word line) and the bit line has a two layered structure comprising the silicon nitride film formed by a plasma CVD method at a temperature 500° C. or lower and the silicon nitride film formed by the CVD method without using plasmas and at a temperature from 700 to 800° C.

However, it is also possible to replace the silicon nitride film formed by the plasma CVD method at a temperature of 500° C. or lower with a silicon oxide film formed by a plasma CVD method at a temperature of 500° C. or lower. In this case, the TEOS film described above can be used as the silicon oxide film.

Since the silicon nitride film is not deposited directly, but is provided by way of the silicon oxide film above and on the side wall of the gate electrode (word line) and the bit line, stresses induced from the silicon nitride film relative to the gate electrode (word line) and the bit line can be reduced.

The foregoing embodiments have been explained for a case applied to the DRAM, but the invention is applicable generally to manufacturing methods of semiconductor integrated circuit devices, or constituting the gate electrode of a MISFET with a conduction film containing at least one layer of metal film, and for forming a contact hole for connection of wirings to one of the source region and the drain region by self alignment.

Advantageous effects obtained by typical features among those disclosed by the present application will be explained simply as below.

According to the manufacturing method of the present invention, since it is possible to suppress oxidation on the surface of the metal film constituting a portion of the gate electrode by depositing the silicon nitride film (cap insulation film) covering a portion over the gate electrode of the MISFET and the silicon nitride film constituting the side wall spacer at a temperature of 500° C. or lower, it is possible to reduce the resistance of the gate electrode and improve the operation speed of the MISFET.

What is claimed is:

1. A method of manufacturing a semiconductor integrated circuit device having a MISFET including a gate electrode, source and drain region, the method comprising the steps of:
    (a) depositing a gate electrode material containing a refractory metal film over a reaction preventive film which is formed over a polysilicon film over a semiconductor substrate;
    (b) depositing a first insulating film on said gate electrode material at a temperature of 500° C. or lower;
    (c) forming a gate electrode by etching said first insulating film and said gate electrode material;
    (d) introducing impurities into said semiconductor substrate at both sides of said gate electrode to form a source region and a drain region;
    (e) depositing a second insulating film over said gate electrode and said semiconductor substrate, and etching said second insulating film to form a sidewall spacer on a sidewall of said gate electrode,
    (f) depositing a third insulating film over said gate electrode and said semiconductor substrate;
    (g) etching said third insulating film to form a contact hole exposing the surface of said source region or drain region; and
    (h) forming a conductor film in said contact hole.

2. The method of manufacturing a semiconductor integrated circuit device according to claim 1, wherein said first and second insulating films comprise silicon nitride films and said third insulating film comprises a silicon oxide film.

3. The method of manufacturing a semiconductor integrated circuit device according to claim 1, wherein said first insulating film is deposited by a plasma CVD method.

4. The method of manufacturing a semiconductor integrated circuit device according to claim 1, wherein said first and second insulating films comprise silicon oxide films and said third insulating film comprises a silicon nitride film.

5. The method of manufacturing a semiconductor integrated circuit device according to claim 4, wherein said first insulating film is deposited by a plasma CVD method.

6. The method of manufacturing a semiconductor integrated circuit device according to claim 3, wherein said refractory metal comprises a tungsten film.

7. The method for manufacturing a semiconductor integrated circuit device as defined in claim 1, wherein the reaction preventive film is made of a material selected from the group consisting of titanium nitride, tungsten nitride and aluminum oxide.

8. A method of manufacturing a semiconductor integrated circuit device having a MISFET with source, drain and gate electrode, the method comprising the steps of:
    (a) depositing a first conductive film of a refractory metal over a reaction preventive film which is formed over a polysilicon film over a main surface of a semiconductor substrate;
    (b) depositing a first insulating film of silicon nitride by a plasma CVD method on a surface of said first conductive film;
    (c) patterning said first insulating film and said first conductive film to form a gate electrode of said MISFET;
    (d) introducing impurities into said semiconductor substrate in a self-alignment manner with said gate electrode in order to form a semiconductor region acting as said source and drain;
    (e) depositing a second insulating film over said gate electrode and said silicon substrate and applying anisotropic etching to said second insulating film to form a sidewall spacer on a side surface of said gate electrode;
    (f) depositing a third insulating film of silicon oxide over said gate electrode and said sidewall spacer;
    (g) etching said third insulating film to form an opening that exposes one of said semiconductor regions.

9. The method of manufacturing a semiconductor integrated circuit device according to claim 8, wherein said refractory metal comprises a tungsten film.

10. The method of manufacturing a semiconductor integrated circuit device according to claim 8, further including a step of applying chemical and mechanical polishing to a surface of said third insulating film before etching said third insulating film.

11. The method of manufacturing a semiconductor integrated circuit device according to claim 8, further comprising a step of forming a second conductive film in said opening.

12. The method for manufacturing a semiconductor integrated circuit device as defined in claim 8, wherein the reaction preventive film is made of a material selected from the group consisting of titanium nitride, tungsten nitride and aluminum oxide.

13. A method of manufacturing a semiconductor integrated circuit device having a MISFET with source, drain and gate electrode, the method composing the steps of:
    (a) depositing a first conductive film of a refractory metal over a reaction preventive film which is formed over a polysilicon film over a main surface of a semiconductor substrate;
    (b) depositing a first insulating film by a plasma CVD method on a surface of said first conductive film;
    (c) patterning said first insulating film and said first conductive film to form a gate electrode of said MISFET;

(d) introducing first impurities into said semiconductor substrate in a self-alignment manner with said gate electrode in order to form first semiconductor regions;

(e) depositing a second insulating film over said gate electrode and said silicon substrate and applying anisotropic etching to said second insulating film to form a sidewall spacer on a side surface of said gate electrode;

(f) introducing second impurities into said semiconductor substrate at both sides of said gate electrode and said sidewall to form second semiconductor regions.

14. The method of manufacturing a semiconductor integrated circuit device according to claim 13, wherein said first insulating film is deposited at a temperature of 500° C. or lower.

15. The method of manufacturing a semiconductor integrated circuit device according to claim 14, wherein said first insulating film comprises silicon nitride film.

16. The method of manufacturing a semiconductor integrated circuit device according to claim 14, wherein said first impurities have same conductivity type as said second impurities.

17. The method for manufacturing a semiconductor integrated circuit device as defined in claim 13, wherein the reaction preventive film is made of a material selected from the group consisting of titanium nitride, tungsten nitride and aluminum oxide.

18. A method of manufacturing a semiconductor integrated circuit device having a MISFET including a gate electrode, a source region and a drain region, the method comprising the steps of:

(a) depositing a polycrystalline silicon film over a semiconductor substrate;

(b) depositing a reaction preventive film over said polycrystalline silicon film;

(c) depositing a refractory metal film over said reaction preventive film;

(d) depositing a first insulating film by a plasma CVD method on said refractory metal film;

(e) patterning said first insulating film, said refractory metal film and said polycrystalline silicon film, to form said gate electrode of said MISFET;

(f) introducing impurities into said semiconductor substrate at both sides of said gate electrode to form said source region and said drain region.

19. The method of manufacturing a semiconductor integrated circuit device according to claim 18, wherein said first insulating film deposited at a temperature of 500° C. or lower.

20. The method of manufacturing a semiconductor integrated circuit device according to claim 19, wherein said first insulating film comprises a silicon nitride film.

21. The method of manufacturing a semiconductor integrated circuit device according to claim 18, wherein said refractory metal comprises a tungsten film.

22. The method for manufacturing a semiconductor integrated circuit device as defined in claim 18, wherein the reaction preventive film is made of a material selected from the group consisting of titanium nitride, tungsten nitride and aluminum oxide.

23. A method of manufacturing a semiconductor integrated circuit device having a MISFET, the method comprising the steps of:

(a) depositing a gate electrode material containing a refractory metal film over a reaction preventive film which is formed over a polysilicon film over a semiconductor substrate, (b) etching said gate electrode material by using a photoresist as a mask, to form a gate electrode, (c) introducing impurities into said semiconductor substrate, to form a source region and a drain region;

(d) depositing, a first insulation film covering over a surface of said metal film of said gate electrode at a temperature of 500° C. or lower;

(e) depositing a second insulation film having an etching rate approximately identical with that of said second insulation film at a temperature of 500° C. or higher over said first insulation film, (f) etching said second and first insulation films to form side wall spacers on the side wall of said gate electrode, (g) depositing a third insulation film having an etching rate different from said first and second insulation films over said gate electrode, and (h) etching said third insulation film by using a photoresist as a mask, to form a contact hole for connection of wiring to one of said source region and drain region.

24. The method of manufacturing a semiconductor integrated circuit device as defined in claim 23, wherein said first and second insulation films are silicon nitride films.

25. The method of manufacturing a semiconductor integrated circuit device as defined in claim 23, wherein said first insulation films is silicon oxide film and said second insulation film is a silicon nitride film.

26. The method of manufacturing a semiconductor integrated circuit device according to claim 23, wherein said first insulating films are deposited by a plasma CVD method.

27. The method for manufacturing a semiconductor integrated circuit device as claimed in claim 23, wherein reaction preventive film is made of a material selected from the group consisting of titanium nitride, tungsten nitride and aluminum oxide.

28. A method of manufacturing a semiconductor integrated circuit device having a MISFET, the method comprising the step of (a) depositing a first conductive film of a refractory metal over a reaction preventive film which is formed over a polysilicon film over a main surface of a semiconductor substrate, (b) fabricating the first conductive film into a predetermined pattern, to form a gate electrode of the MISFET, (c) introducing impurities into the semiconductor substrate in alignment with said gate electrode (WL) for forming semiconductor regions that function as the source and the drain, (d) depositing a first silicon nitride film on a surface of said metal film of said gate electrode and a second silicon nitride film on said first silicon nitride film, (e) applying anisotropic etching to said second and said first silicon nitride films to form side wall spacers on the side wall of said gate electrode, (f) depositing an oxide film over said gate electrode and said side wall spacers, and (g) etching to said oxide film for forming an opening to said oxide film for exposing a portion of the semiconductor region, wherein said first silicon nitride films is formed at a temperature lower than said second silicon nitride film.

29. The method of manufacturing a semiconductor integrated circuit device as defined in claim 28, wherein said first silicon nitride films is formed by a plasma CVD method.

30. The method of manufacturing a semiconductor integrated circuit device as defined in claim 28, further including a step of depositing a second conductive film in the opening.

31. The method of manufacturing a semiconductor integrated circuit device as defined in claim 28, wherein said first conductive film is formed from a refractory metal by a sputtering method.

32. The method of manufacturing a semiconductor integrated circuit device as defined in claim 28, the reaction preventive film comprises a titanium nitride film.

33. The method of manufacturing a semiconductor integrated circuit device as defined in claim 28, further including a step of applying chemical and mechanical polishing to the surface of the oxide film after depositing the oxide film.

34. The method for manufacturing a semiconductor integrated circuit device as defined in claim 28, wherein the reaction preventive film is made of a material selected from the group consisting of titanium nitride, tungsten nitride and aluminum oxide.

* * * * *